(12) United States Patent
Smith et al.

(10) Patent No.: US 6,380,105 B1
(45) Date of Patent: Apr. 30, 2002

(54) LOW VOLATILITY SOLVENT-BASED METHOD FOR FORMING THIN FILM NANOPOROUS AEROGELS ON SEMICONDUCTOR SUBSTRATES

(75) Inventors: Douglas M. Smith; Gregory P. Johnston; William C. Ackerman, all of Albuquerque, NM (US); Richard A. Stoltz, Plano, TX (US); Alok Maskara; Teresa Ramos, both of Albuquerque, NM (US); Shin-Puu Jeng, Plano; Bruce E. Gnade, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/324,370

(22) Filed: Jun. 2, 1999

Related U.S. Application Data

(62) Division of application No. 08/746,680, filed on Nov. 14, 1996, now Pat. No. 5,955,140.

(51) Int. Cl.$^7$ .................. H01L 21/31; H01L 21/469
(52) U.S. Cl. .................. 438/778; 438/780; 438/781
(58) Field of Search .................. 438/409, 408, 438/404, 421, 960, 778, 780, 781; 65/395; 106/287.34; 505/735; C04B 35/624

(56) References Cited

U.S. PATENT DOCUMENTS

| | | | |
|---|---|---|---|
| 3,640,093 A | * | 2/1972 | Levene et al. ............ 65/17.2 |
| 3,652,216 A | | 3/1972 | Krekeler et al. ........... 23/182 |

(List continued on next page.)

FOREIGN PATENT DOCUMENTS

| | | |
|---|---|---|
| EP | 0 382 310 A2 | 8/1990 |
| EP | 0 454 239 A2 | 10/1991 |
| JP | A-54 109765 | 8/1979 |
| JP | A-06 293971 | 10/1994 |
| WO | WO 92/03378 | 3/1992 |

OTHER PUBLICATIONS

Tillotson et al., "Transparent ultralow–density silica aerogels prepared by a two–step sol–gel process", Journal of Non–Crystalline Solids, 145 (1992), pp. 44–50.

D. Basmadjian et al., "The Control of the Pore Volume and Pore Size Distribution in Alumina and Gels by the Addition of Water Soluble Organic Polymers", Dec. 1962, Journal of Catalysis, vol. 1, No. 6, pp. 547–563.

Fricke et al., "Aerogels", May 28, 1992, J. Am. Ceram. Soc., 75(8), pp. 2027–2036.

(List continued on next page.)

*Primary Examiner*—Matthew Smith
*Assistant Examiner*—Lex H. Malsawma
(74) *Attorney, Agent, or Firm*—David Denker; Wade James Brady, III; Frederick J. Telecky, Jr.

(57) ABSTRACT

This invention has enabled a new, simple thin film nanoporous dielectric fabrication method. In general, this invention uses glycerol, or another low volatility compound, as a solvent. This new method allows thin film aerogels/low density xerogels to be made without supercritical drying, freeze drying, or a surface modification step before drying. Thus, this invention allows production of nanoporous dielectrics at room temperature and atmospheric pressure, without a separate surface modification step. Although this new method allows fabrication of aerogels without substantial pore collapse during drying, there may be some permanent shrinkage during aging and/or drying. This invention allows controlled porosity thin film nanoporous aerogels to be deposited, gelled, aged, and dried without atmospheric controls. In another aspect, this invention allows controlled porosity thin film nanoporous aerogels to be deposited, gelled, rapidly aged at an elevated temperature, and dried with only passive atmospheric controls, such as limiting the volume of the aging chamber.

43 Claims, 10 Drawing Sheets

U.S. PATENT DOCUMENTS

| | | | | |
|---|---|---|---|---|
| 3,689,637 | A | 9/1972 | Pader | 424/52 |
| 3,860,431 | A | 1/1975 | Payne et al. | 252/309 |
| 3,997,501 | A | 12/1976 | McLeod | 260/37 SB |
| 4,104,363 | A | 8/1978 | Vozka et al. | 423/338 |
| 4,169,926 | A | 10/1979 | McDaniel | 526/100 |
| 4,230,773 | A | 10/1980 | Bakos | 428/447 |
| 4,230,803 | A | 10/1980 | Weidenbach et al. | 435/176 |
| 4,311,738 | A | 1/1982 | Chi | 427/387 |
| 4,548,646 | A | 10/1985 | Mosser et al. | 106/14.12 |
| 4,584,365 | A | 4/1986 | Jada et al. | 528/271 |
| 4,608,316 | A | 8/1986 | Toda et al. | 428/446 |
| 4,619,908 | A * | 10/1986 | Cheng et al. | 502/214 |
| 4,652,467 | A | 3/1987 | Brinker et al. | 427/246 |
| 4,713,233 | A | 12/1987 | Marsh et al. | 423/608 |
| 4,851,150 | A | 7/1989 | Hench et al. | 252/315.6 |
| 4,943,542 | A | 7/1990 | Hayashi et al. | 501/12 |
| 4,954,327 | A | 9/1990 | Blount | 423/338 |
| 4,987,101 | A | 1/1991 | Kaanta et al. | 437/228 |
| 5,028,352 | A * | 7/1991 | Hietala et al. | 516/111 |
| 5,076,980 | A | 12/1991 | Nogues et al. | 264/65 |
| 5,091,009 | A | 2/1992 | Nogami et al. | 106/287.23 |
| 5,097,317 | A | 3/1992 | Fujimoto et al. | 357/72 |
| 5,103,288 | A | 4/1992 | Sakamoto et al. | 357/71 |
| 5,139,980 | A | 8/1992 | Nakahara et al. | 501/12 |
| 5,155,576 | A | 10/1992 | Mizushima | 357/71 |
| 5,207,814 | A | 5/1993 | Cogliati et al. | 65/18.3 |
| 5,226,930 | A | 7/1993 | Sasaki | 51/308 |
| 5,229,335 | A * | 7/1993 | Salomon et al. | 501/1 |
| 5,242,647 | A | 9/1993 | Poco | 264/225 |
| 5,270,027 | A | 12/1993 | Balducci et al. | 423/338 |
| 5,275,796 | A | 1/1994 | Tillotson et al. | 423/338 |
| 5,294,480 | A | 3/1994 | Mielke et al. | 428/240 |
| 5,302,548 | A | 4/1994 | Watanabe et al. | 437/187 |
| 5,320,983 | A | 6/1994 | Ouellet | 437/231 |
| 5,352,637 | A | 10/1994 | Fabry et al. | 437/238 |
| 5,368,887 | A | 11/1994 | Hoshino et al. | 427/226 |
| 5,391,364 | A | 2/1995 | Cogliati | 423/335 |
| 5,393,712 | A | 2/1995 | Rostoker et al. | 437/238 |
| 5,395,805 | A * | 3/1995 | Droege et al. | 501/12 |
| 5,405,805 | A | 4/1995 | Homma | 437/195 |
| 5,409,600 | A * | 4/1995 | Weissman et al. | 208/216 R |
| 5,409,683 | A | 4/1995 | Tillotson et al. | 423/338 |
| 5,457,073 | A | 10/1995 | Ouellet | 437/231 |
| 5,470,802 | A | 11/1995 | Gnade et al. | 437/238 |
| 5,472,913 | A | 12/1995 | Havemann et al. | 437/195 |
| 5,488,015 | A | 1/1996 | Havemann et al. | 437/195 |
| 5,489,553 | A | 2/1996 | Chen | 437/195 |
| 5,494,858 | A | 2/1996 | Gnade et al. | 437/231 |
| 5,494,863 | A | 2/1996 | Mathur | 501/12 |
| 5,496,527 | A | 3/1996 | Yokogawa et al. | 423/338 |
| 5,504,042 | A | 4/1996 | Cho et al. | 437/247 |
| 5,519,250 | A | 5/1996 | Numata | 257/632 |
| 5,522,976 | A | 6/1996 | Campet et al. | 204/298.13 |
| 5,523,615 | A | 6/1996 | Cho et al. | 257/632 |
| 5,525,857 | A | 6/1996 | Gnade et al. | 313/309 |
| 5,536,965 | A | 7/1996 | Beratan et al. | 257/444 |
| 5,538,931 | A * | 7/1996 | Heinrichs et al. | 502/234 |
| 5,548,159 | A | 8/1996 | Jeng | 257/634 |
| 5,561,318 | A | 10/1996 | Gnade et al. | 257/638 |
| 5,610,109 | A * | 3/1997 | Anderson et al. | 201/80 |
| 5,656,848 | A | 8/1997 | Beratan et al. | 257/446 |
| 5,661,344 | A | 8/1997 | Havemann et al. | 257/758 |
| 5,680,713 | A * | 10/1997 | Forbert et al. | 34/342 |
| 5,698,483 | A | 12/1997 | Ong et al. | 501/12 |
| 5,723,368 | A | 3/1998 | Cho et al. | 437/763 |
| 5,736,425 | A | 4/1998 | Smith et al. | 438/778 |
| 5,746,992 | A | 5/1998 | Yoldas et al. | 423/338 |
| 5,747,880 | A | 5/1998 | Havemann et al. | 257/759 |
| 5,750,415 | A | 5/1998 | Gnade et al. | 427/195 |
| 5,753,305 | A | 5/1998 | Smith et al. | 427/335 |
| 5,789,819 | A | 8/1998 | Gnade et al. | |
| 5,804,508 | A | 9/1998 | Gnade et al. | |
| 5,807,607 | A | 9/1998 | Smith et al. | |
| 5,847,443 | A | 12/1998 | Cho et al. | |
| 5,858,871 | A | 1/1999 | Jeng | |
| 5,914,183 | A * | 6/1999 | Canham | 428/312.6 |
| 5,955,140 | A | 9/1999 | Smith et al. | |
| 6,037,277 | A | 3/2000 | Maskara et al. | |
| 6,063,714 | A | 5/2000 | Smith et al. | |
| 6,130,152 | A | 10/2000 | Smith et al. | |
| 6,159,295 | A | 12/2000 | Maskara et al. | |
| 6,171,645 | B1 | 1/2001 | Smith et al. | |

OTHER PUBLICATIONS

Einarsrud et al., Chem. Process. Adv. Matl., (1992) pp. 355–361 (abstract only).

Haereid, Siv et al., "Mechanical Strengthening of TMOS–Based Alcogels by Aging in Silane Solutions", 1994, Journal of Sol–Gel Science and Tech., vol. 3, pp. 199–204.

Haereid, Siv, "Preparation and Characterization of Transparent, Monolithic Silica Xerogels with Low Density", Jan. 1993, Norwegian Institute of Technology, Dept. Of Inorganic Chemistry.

Hrubesh et al., "Dielectric Properties of Aerogels", J. Materials Research, vol. 8, No. 7, Jul. 1993, pp. 1736–1741.

V. S. Klimenko, L. A. Kulik, and V. V. Vashchinskaya, "Dependence of the Composition and Structure of Silicic Acid Xerogels on the Nature of the Solvent", 1986, Ukrainskii Khimicheskii Zhurnal, vol. 52, No. 12, pp. 1247–1251.

Smith et al., "Preparation of low–density xerogels at ambient pressure", Journal of Non–Crystalline Solids, 186 (1995) pp. 104–112.

Yokogawa, H., Yokoyama, M., "Hydrophobic Silica Aerogels", Journal of Non–Crystalline Solids, 186 (1995) pp. 23–29.

Poco et al., "A rapid Supercritical Extraction Process for the Production of Silica Aerogels", Mat. Res. Soc. Symp. Proc. vol. 431 (1996) pp. 297–302, Materials Research Society.

Prakash et al., "Ambient–Pressure silica Aerogel Films", Mat. Res. Soc. Symp. Proc. vol. 371 (1995) pp. 205–210, Materials Research Society.

Smith et al., "Preparation of Low–Density Xerogels at Ambient Pressure for Low K Dielectrics", Mat. Res. Soc. Symp. Proc. vol. 371 (1995) pp. 261–272, Materials Research Society.

U.S. Patent Application Ser. No. 08/746,688, filed Nov. 14, 1996.

U.S. Patent Application Ser. No. 08/748,927, filed Nov. 14, 1996.

U.S. Patent Application Ser. No. 09/178,715, filed Oct. 26, 1998.

U.S. Patent Application Ser. No. 09/488,185, filed Jan. 20, 2000.

U.S. Patent Application Ser. No. 09/549,289, filed Apr. 14, 2000.

U.S. Patent Application Ser. No. 09/573,564, filed May 19, 2000.

U.S. Patent Application Ser. No. 09/757,073, filed Jan. 8, 2001.

* cited by examiner

LOW VOLATILITY SOLVENT-BASED METHOD FOR FORMING THIN FILM NANOPOROUS AEROGELS ON SEMICONDUCTOR SUBSTRATES

This application is a divisional of application Ser. No. 08/746,680 filed Nov. 14, 1996, now U.S. Pat. No. 5,955,140.

This application claims the benefit of priority from the following U.S. provisional applications:

| Filing Date | Appl. # | Attorney Docket | Title |
| --- | --- | --- | --- |
| 11/16/95 | 60/006,852 | TI-21620P | RapidAgingTechniqueforAerogelThinFilms. |
| 1/24/96 | 60/010,511 | TI-21622P | NanoporousDielectricThinFilmSurfaceModification |
| 11/16/95 | 60/006,853 | TI-21623P | AerogelThinFilmFormationFromMulti-SolventSystems. |
| 11/16/95 | 60/006,861 | TI-21624P | NanoporousDielectricFormationUsingAPost-DepositionCatalyst. |
| 3/4/96 | 60/012,764 | TI-22177P | Glycol-BasedMethodforForminga ThinFilmNanoporousDielectric. |
| 3/4/96 | 60/012,765 | TI-22778P | Glycol-BasedPrecursorsForAerogels |
| 3/4/96 | 60/012,763 | TI-22779P | Glycol-BasedMethodForForminga ThinFilmAerogelonaPassiveSubstrate |
| 3/4/96 | 60/012,799 | TI-22780P | Glycol-BasedMethodForFormingBulkAerogels |
| 3/25/96 | 60/014,009 | TI-22781P | Polyol-BasedPrecursorsForAerogels |
| 3/25/96 | 60/014,005 | TI-22782P | Polyol-BasedMethodForFormingThin FilmAerogelsOnSemiconductorSubstrates |
| 3/25/96 | 60/014,008 | TI-22783P | Polyol-BasedPrecursorsForForminga ThinFilmAerogelonaPassive Substrate |
| 3/25/96 | 60/014,146 | TI-22784P | Polyol-BasedMethodForFormingBulk Aerogels |
| 3/4/96. | 60/012,800 | TI-22788P | LowVolatilitySolvent-BasedMethodFor FormingAerogels |
| 7/31/96. | 60/022,842 | TI-23260P | DevicestoHeatTreatSaturatedPorous Films |

FIELD OF THE INVENTION

This invention pertains generally to precursors and deposition methods for thin film nanoporous aerogels on semiconductor substrates, including deposition methods suited to aerogel thin film fabrication of nanoporous dielectrics.

BACKGROUND OF THE INVENTION

Aerogels are porous silica materials which can be used for a variety of purposes including as films (e.g. as electrical insulators on semiconductor devices or as optical coatings) or in bulk (e.g. as thermal insulators). For ease of discussion, the examples herein will be mainly of usage as electrical insulators on semiconductor devices.

Semiconductors are widely used in integrated circuits for electronic devices such as computers and televisions. Semiconductor and electronics manufacturers, as well as end users, desire integrated circuits which can accomplish more in less time in a smaller package while consuming less power. However, many of these desires are in opposition to each other. For instance, simply shrinking the feature size on a given circuit from 0.5 microns to 0.25 microns can increase energy use and heat generation by 30%. Miniaturization also generally results in increased capacitive coupling, or crosstalk, between conductors which carry signals across the chip. This effect both limits achievable speed and degrades the noise margin used to insure proper device operation. One way to reduce energy use/heat generation and crosstalk effects is to decrease the dielectric constant of the insulator, or dielectric, which separates conductors. U.S. Pat. No. 5,470,802, issued to Gnade et al., provides background on several of these schemes.

A class of materials, nanoporous dielectrics, includes some of the most promising new materials for semiconductor fabrication. These dielectric materials contain a solid structure, for example of silica, which is permeated with an interconnected network of pores having diameters typically on the order of a few nanometers. These materials may be formed with extremely high porosities, with corresponding dielectric constants typically less than half the dielectric constant of dense silica. And yet despite their high porosity, it has been found that nanoporous dielectrics may be fabricated which have high strength and excellent compatibility with most existing semiconductor fabrication processes. Thus nanoporous dielectrics offer a viable low-dielectric constant replacement for common semiconductor dielectrics such as dense silica.

The preferred method for forming nanoporous dielectrics is through the use of sol-gel techniques. The word sol-gel does not describe a product but a reaction mechanism whereby a sol, which is a colloidal suspension of solid particles in a liquid, transforms into a gel due to growth and interconnection of the solid particles. One theory is that through continued reactions within the sol, one or more molecules in the sol may eventually reach macroscopic dimensions so that it/they form a solid network which extends substantially throughout the sol. At this point (called the gel point), the substance is said to be a gel. By this definition, a gel is a substance that contains a continuous solid skeleton enclosing a continuous liquid phase. As the skeleton is porous, the term "gel" as used herein means an open-pored solid structure enclosing a pore fluid.

One method of forming a sol is through hydrolysis and condensation reactions, which can cause a multifunctional monomer in a solution to polymerize into relatively large, highly branched particles. Many monomers suitable for such polymerization are metal alkoxides. For example, a tetra-ethoxysilane (TEOS) monomer may be partially hydrolyzed in water by the reaction $$Si(OEt)_4 + H_2O \rightarrow HO\text{—}Si(OEt)_3 + EtOH$$

Reaction conditions may be controlled such that, on the average, each monomer undergoes a desired number of hydrolysis reactions to partially or fully hydrolyze the monomer. TEOS which has been fully hydrolyzed becomes $Si(OH)_4$. Once a molecule has been at least partially hydrolyzed, two molecules can then link together in a condensation reaction, such as $$(OEt)_3Si\text{—}OH + HO\text{—}Si(OH)_3 \rightarrow (OEt)_3Si\text{—}O\text{—}Si(OH)_3 + H_2O$$

or $$(OEt)_3Si\text{—}OEt + HO\text{—}Si(OEt)_3 \rightarrow (OEt)_3Si\text{—}O\text{—}Si(OEt)_3 + EtOH$$

to form an oligomer and liberate a molecule of water or ethanol. The Si—O—Si configuration in the oligomer formed by these reactions has three sites available at each end for further hydrolysis and condensation. Thus, additional monomers or oligomers can be added to this molecule in a somewhat random fashion to create a highly branched polymeric molecule from literally thousands of monomers. An oligomerized metal alkoxide, as defined herein, comprises molecules formed from at least two alkoxide monomers, but does not comprise a gel.

Sol-gel reactions form the basis for xerogel and aerogel film deposition. In a typical thin film xerogel process, an ungelled precursor sol may be applied (e.g., spray coated, dip-coated, or spin-coated) to a substrate to form a thin film on the order of several microns or less in thickness, gelled, and dried to form a dense film. The precursor sol often comprises a stock solution and a solvent, and possibly also a gelation catalyst that modifies the pH of the precursor sol in order to speed gelation. During and after coating, the volatile components in the sol thin film are usually allowed to rapidly evaporate. Thus, the deposition, gelation, and drying phases may take place simultaneously (at least to some degree) as the film collapses rapidly to a dense film. In contrast, an aerogel process differs from a xerogel process largely by avoiding pore collapse during drying of the wet gel. Some methods for avoiding pore collapse include wet gel treatment with condensation-inhibiting modifying agents (as described in Gnade '802) and supercritical pore fluid extraction.

SUMMARY OF THE INVENTION

Between aerogels and xerogels, aerogels are the preferable of the two dried gel materials for semiconductor thin film nanoporous dielectric applications. Typical thin film xerogel methods produce films having limited porosity (up to 60% with large pore sizes, but generally substantially less than 50% with pore sizes useful in submicron semiconductor fabrication). While some prior art xerogels have porosities greater than 50%; these prior art xerogels had substantially larger pore sizes (typically above 100 nm). These large pore size gels have significantly less mechanical strength. Additionally, their large size makes them unsuitable for filling small (typically less than 1 mm, and potentially less than 100 nm) patterned gaps on a microcircuit and limits their optical film uses to only the longer wavelengths. A nanoporous aerogel thin film, on the other hand, may be formed with almost any desired porosity coupled with a very fine pore size. Generally, as used herein, nanoporous materials have average pore sizes less than about 25 nm across, but preferably less than 20 nm (and more preferably less than 10 nanometers and still more preferably less than 5 nanometers). In many formulations using this method, the typical nanoporous materials for semiconductor applications may have average pore sizes at least 1 nm across, but more often at least 3 nm. The nanoporous inorganic dielectrics include the nanoporous metal oxides, particularly nanoporous silica.

In many nanoporous thin film applications, such as aerogels and xerogels used as optical films or in microelectronics, the precise control of film thickness and aerogel density are desirable. Several important properties of the film are related to the aerogel density, including mechanical strength, pore size and dielectric constant. It has now been found that both aerogel density and film thickness are related to the viscosity of the sol at the time it is applied to a substrate. This presents a problem which was heretofore unrecognized. This problem is that with conventional precursor sols and deposition methods, it is extremely difficult to control both aerogel density and film thickness independently and accurately.

Nanoporous dielectric thin films may be deposited on patterned wafers, often over a level of patterned conductors. It has now been recognized that sol deposition should be completed prior to the onset of gelation to insure that gaps between such conductors remain adequately filled and that the surface of the gel remains substantially planar. To this end, it is also desirable that no significant evaporation of pore fluid occur after gelation, such as during aging. Unfortunately, it is also desirable that the gel point be reachable as soon after deposition as possible to simplify processing, and one method for speeding gelation of thin films is to allow evaporation to occur. It is recognized herein that a suitable precursor sol for aerogel deposition should allow control of film thickness, aerogel density, gap fill and planarity, and be relatively stable prior to deposition, and yet gel relatively soon after deposition and age without substantial evaporation.

A method has now been found which allows controlled deposition of aerogel thin films from a multi-solvent precursor sol. In this method, sol viscosity and film thickness may be controlled relatively independently. This allows film thickness to be rapidly changed from a first known value to a second known value which can be set by solvent ratios and spin conditions, thus keeping film thickness largely independent of aerogel density and allowing rapid gelation. However, at the same time, the solid:liquid ratio present in the film at drying (and therefore the aerogel density) can be accurately determined in the precursor sol prior to deposition, independent of spin conditions and film thickness.

Even with this novel separation of the deposition problem into viscosity control and density control subproblems, our experience has been that thin film sol-gel techniques for forming xerogels and aerogels generally require some method, such as atmospheric control, to limit evaporation before drying, such as after gelation and during aging. In principle, this evaporation rate control can be accomplished by controlling the solvent vapor concentration above the wafer. However, our experience has shown that the solvent evaporation rate is very sensitive to small changes in the vapor concentration and temperature. In an effort to better understand this process, we have modeled the isothermal vaporization of several solvents from a wafer as a function of percent saturation. The ambient temperature evaporation rates for some of these solvents are given in FIG. 1. For evaporation to not be a processing problem, the product of the evaporation rate and processing time (preferably on the order of minutes) should be significantly less than the film thickness. This suggests that for solvents such as ethanol, the atmosphere above the wafer would have to be maintained at over 99% saturation. However, there can be problems associated with allowing the atmosphere to reach saturation or supersaturation. Some of these problems are related to condensation of an atmospheric constituent upon the thin film. Condensation on either the gelled or ungelled thin film has been found to cause defects in an insufficiently aged film. Thus, it is generally desirable to control the atmosphere such that no constituent is saturated.

Rather than using a high volatility solvent and precisely controlling the solvent atmosphere, we have discovered that a better solution is to use a low volatility solvent with less atmospheric control. Upon investigating this premise, we have discovered that glycerol makes an excellent solvent.

The use of glycerol allows a loosening (as compared to prior art solvents) of the required atmospheric control during deposition, gelation, and/or aging. This is because, that even though saturation should still preferably be avoided, the atmospheric solvent concentration can be lowered without excessive evaporation. FIG. 2 shows how the evaporation rate of glycerol varies with temperature and atmospheric solvent concentration. It has been our experience that, with glycerol, acceptable gels can be formed by depositing, gelling and aging in an uncontrolled or a substantially uncontrolled atmosphere.

In the production of nanoporous dielectrics it is preferable to subject the wet gel thin film to a process known as aging. Hydrolysis and condensation reactions do not stop at the gel point, but continue to restructure, or age, the gel until the reactions are purposely halted. It is believed that during aging, preferential dissolution and redeposition of portions of the solid structure produce beneficial results, including higher strength, greater uniformity of pore size, and a greater ability to resist pore collapse during drying. Unfortunately, we have now found that conventional aging techniques used for bulk gels are poorly suited for aging thin films in semiconductor processing, partly because they generally require liquid immersion of the substrate and partly because they require days or even weeks to complete. One aspect of this invention includes a vapor phase aging technique that avoids liquid immersion or premature drying of the wet gel thin film and that, surprisingly, can age such a thin film in a matter of minutes.

Again, aerogels are nanoporous materials which can be used for a variety of purposes including as films or in bulk. It should be noted, however, the problems incurred in film fabrication processing is so different from bulk processing problems, that, for practical purposes, film processing is not analogous to bulk processing.

Generally, we have now found that aging in a saturated atmosphere avoids the difficulties encountered with liquid immersion aging. Furthermore, this aspect of the invention provides several approaches for aging wet gels at increased temperatures. These methods may be used even when the wet gel originally contains low boiling point pore liquids. However, they work better with low volatility solvents. Finally, this aspect of the invention provides for adding an optional vapor phase aging catalyst to the aging atmosphere to speed aging.

Aging a wet gel in thin film form is difficult, as the film contains an extremely small amount of pore fluid that should be held fairly constant for a period of time in order for aging to occur. If pore fluid evaporates from the film before aging has strengthened the network, the film will tend to densify in xerogel fashion. On the other hand, if excess pore fluid condenses from the atmosphere onto the thin film before the network has been strengthened, this may locally disrupt the aging process and cause film defects.

Thus, we now know that some method of pore fluid evaporation rate control during aging is beneficial to aerogel thin film fabrication. In principle, evaporation rate control during aging can be accomplished by actively controlling the pore fluid vapor concentration above the wafer. However, the total amount of pore fluid contained in, for instance, a 1 mm thick 70% porous wet gel deposited on a 150 mm wafer is only about 0.012 mL, an amount that would easily fit in a single 3 mm diameter drop of fluid. Typical thin films used for nanoporous dielectrics on semiconductor wafers are approximately 1000 times thinner. Thus, actively controlling the pore fluid vapor concentration (by adding or removing solvent to the atmosphere) to allow no more than, e.g., 1%, or less, pore fluid evaporation during aging presents a difficult proposition; the surface area of the thin film is high and the allowable tolerance for pore fluid variations is extremely small. In particular, evaporation and condensation control are especially important for rapid aging at elevated temperature, where film production processes have heretofore apparently not been practically possible.

We have overcome the evaporation rate control problem by not attempting to actively control pore fluid vapor concentration above a wafer at all. Instead, the wafer is processed in an extremely low-volume chamber, such that through natural evaporation of a relatively small amount of the pore fluid contained in the wet gel film, the processing atmosphere becomes substantially saturated in pore fluid. Unless the wafer is cooled at some point in a substantially saturated processing atmosphere, this method also naturally avoids problems with condensation, which should generally be avoided, particularly during high temperature processing.

A method for forming a thin film nanoporous dielectric on a semiconductor substrate is disclosed herein. This method comprises the steps of providing a semiconductor substrate and depositing an nanoporous aerogel precursor sol upon the substrate. This aerogel precursor sol comprises a metal-based aerogel precursor reactant and a first solvent comprising glycerol; wherein, the molar ratio of the molecules of glycerol to the metal atoms in the reactant is at least 1:16. The method further comprises allowing the deposited sol to create a gel, wherein the gel comprises a porous solid and a pore fluid; and forming a dry, nanoporous dielectric by removing the pore fluid in a drying atmosphere without substantially collapsing the porous solid. In this method, the pressure of the drying atmosphere during the forming step is less than the critical pressure of the pore fluid, preferably near atmospheric pressure.

Preferably, the aerogel precursor reactant may be selected from the group consisting of metal alkoxides, at least partially hydrolyzed metal alkoxides, particulate metal oxides, and combinations thereof. Preferably, the aerogel precursor reactant comprises silicon. In some embodiments, the aerogel precursor reactant is TEOS. Typically, the molar ratio of the molecules of glycerol to the metal atoms in the reactant is no greater than 12:1, and preferably, the molar ratio of the molecules of glycerol to the metal atoms in the reactant is between 1:2 and 12:1. In some embodiments, the molar ratio of the molecules of glycerol to the metal atoms in the reactant is between 2.5:1 and 12:1. In this method, it is also preferable that the nanoporous dielectric has a porosity greater than 60% and an average pore diameter less than 25 nm. In some embodiments, the aerogel precursor also comprises a second solvent. Preferably, the second solvent has a boiling point lower than glycerol's. In some embodiments, the second solvent may be ethanol. In some embodiments, the first solvent also comprises a glycol, preferably selected from the group consisting of ethylene glycol, 1,4-butylene glycol, 1,5-pentanediol, and combinations thereof. After aging but before drying, in some embodiments, the aging fluid is replaced by a drying fluid. This allows, e.g., rapid, lower temperature (e.g., room temperature) drying with a fluid that evaporates faster and has a suitably low surface tension. Examples of drying fluids include heptane, ethanol, acetone, 2-ethylbutyl alcohol and some alcohol-water mixtures.

Thus, this invention allows controlled porosity thin film nanoporous aerogels to be deposited, gelled, aged, and dried without atmospheric controls. In another aspect, this invention allows controlled porosity thin film nanoporous aerogels to be deposited, gelled, rapidly aged at an elevated temperature, and dried with only passive atmospheric controls, such as limiting the volume of the aging chamber.

BRIEF DESCRIPTION OF THE DRAWINGS

The present invention, including various features and advantages thereof, may be best understood with reference to the following drawings, wherein.

DETAILED DESCRIPTION OF THE PREFERRED EMBODIMENTS

Typical sol-gel thin film processes produce gels which collapse and densify upon drying, thus forming xerogels having only a few percent porosity. Under the uncontrolled drying conditions of xerogel film formation, it has been neither critical nor possible to completely separate the deposition, aggregation, gelation, and drying steps during formation of the thin film, as the entire process may be completed in a few seconds. However, it has now been found that such methods are generally unsuited for depositing high porosity thin films with a controllable low density; because in an aerogel type drying process, the film remains substantially undensified after drying, its final density is largely determined by the solid:liquid ratio in the film at the gel time. It has now been discovered that the following criteria are desirable for aerogel thin film deposition, particularly where the thin film is required to planarize and/or gap fill a patterned wafer:

1) an initial viscosity suitable for spin-on application
2) stable viscosity at deposition
3) stable film thickness at gel time
4) a predetermined solid:liquid ratio at gel time
5) gelation shortly after deposition No prior art precursor sol and method have been found which meet these conditions. However, in accordance with the present invention, it has now been found that a sol prepared with at least two solvents in specific ratios may be used to meet these conditions.

Figure 15:
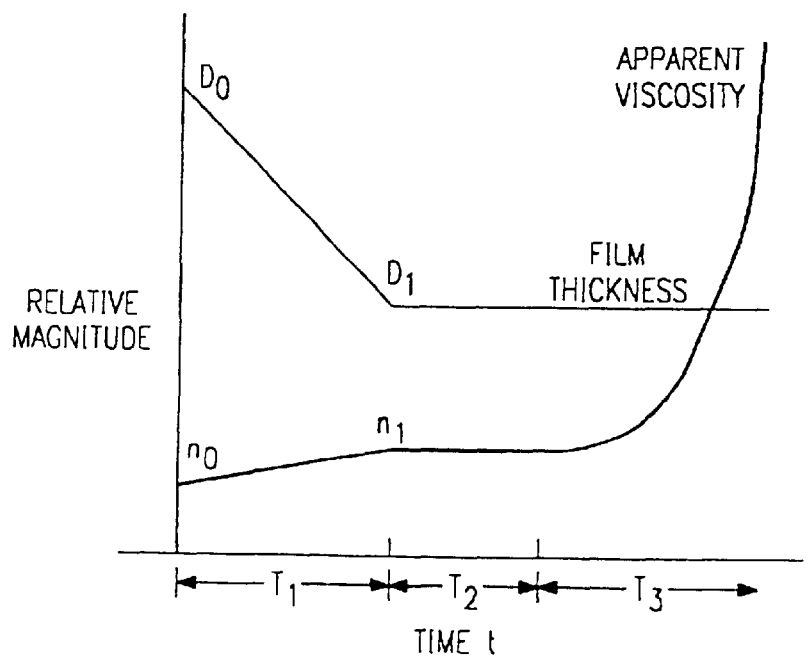
FIG. 15 contains a graph of relative film thickness and relative film viscosity as a function of time for one embodiment of the present invention.

The method of depositing and gelling such a precursor sol can be best understood with reference to FIG. 15.

As shown in FIG. 15 for time t=0, a multi-solvent precursor sol may be spun onto a wafer at an initial film thickness D0 and an initial viscosity h0. This is preferably done in a controlled atmosphere having a partial pressure of the low volatility solvent which greatly retards evaporation of the low volatility solvent from the wafer. Thus after spin-on application, the high volatility solvent is preferentially removed from the wafer during evaporation time period T1 while the low volatility solvent is maintained, thereby decreasing the film thickness to D1. Viscosity also changes during this time to h1, preferably due primarily to the removal of solvent. Ideally, little cross-linking of polymeric clusters in the sol occurs during this time. At the end of T1, substantially all of the high volatility solvent should be evaporated, at which time film thickness should stabilize or proceed to shrink at a much reduced rate, thereby providing a predetermined liquid:solid ratio and thickness for the thin film at gel time.

Time period T2 has the primary purpose of providing separation between the endpoint of evaporation time period T1 and the gel point which occurs during gelation time period T3. Preferably, time period T2 is greater than 0. However, some precursors, particularly those with solvents such as glycerol, that promote faster gelation, will gel toward the end of period T1. Additionally, during time period T1 or T2 a vapor-phase catalyst such as ammonia may be introduced into the controlled atmosphere. This catalyst may diffuse into the thin film, further activating the sol and promoting rapid cross-linking. Although little or no evaporation preferably takes place during T2, viscosity should begin to increase substantially as cross-linking continues to link polymeric clusters.

Evaporation after the gel point may result in poor gap-fill and planarity for patterned wafers. Consequently, after gelation time period T3, film thickness is preferably held nearly constant until the gel point has passed by limiting evaporation. Sometime during time period T3, a marked change in viscosity occurs as the sol nears the gel point, where large polymeric clusters finally join to create a spanning cluster which is continuous across the thin film.

Several advantages of this new approach are apparent from FIG. 15. Sol viscosity and film thickness are both allowed to change rapidly, but generally not at the same time. Also, film thickness is changed from a first known value to a second known value which can be independently set by solvent ratios and spin conditions. Using this method, a low viscosity film may be applied, quickly reduced to a preset thickness, and rapidly gelled at a desired density.

Figure 1:
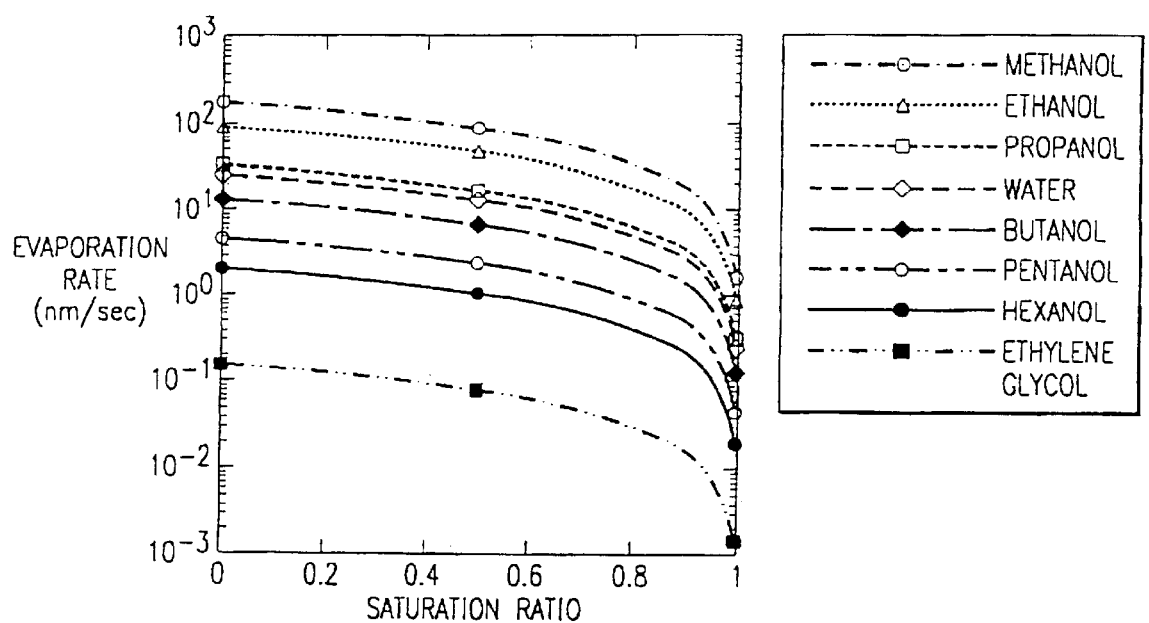
FIG. 1 contains a graph of the variation of evaporation rate with saturation ratio and solvent type.

The preceding paragraphs teach a method of varying the precursor sol viscosity independently of the dried gel density. However, it still leaves open the question of which solvents are most appropriate. Our experience shows that the solvent evaporation rate for traditional aerogel solvents is very sensitive to small changes in the vapor concentration and temperature. In an effort to better understand this process, we have modeled isothermal solvent vaporization from a wafer as a function of percent saturation. This modeling is based on mass transfer theory. *Transport Phenomena*, (particularly Chapters 16 and 17) by R. B. Bird, W. E. Stewart, and E. N. Lightfoot, is a good reference for mass transfer theory. These calculations were performed for a range of solvents. The ambient temperature evaporation rates for some of these solvents are given in FIG. 1. For evaporation to not be a processing problem, the product of the evaporation rate and processing time (preferably on the order of minutes) should be significantly less than the film thickness. This suggests that for solvents such as ethanol, the atmosphere above the wafer would have to be maintained at over about 99% saturation. However, there can be problems associated with allowing the atmosphere to reach saturation or supersaturation. Some of these problems are related to condensation of an atmospheric constituent upon the thin film. Condensation on either the gelled or ungelled thin film has been found to cause defects in an insufficiently aged film. Thus, it is generally desirable to control the atmosphere such that no constituent is saturated.

Rather than using a high volatility solvent and precisely controlling the solvent atmosphere, we have discovered that a better solution is to use a low volatility solvent with less atmospheric control. Upon investigating this premise, we have discovered that glycerol makes an excellent solvent.

Figure 2:
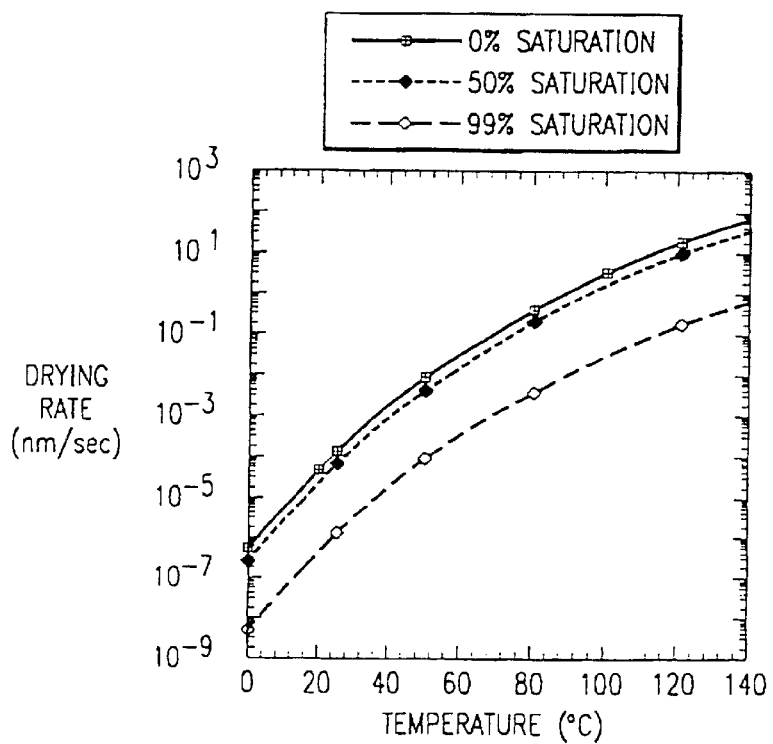
FIG. 2 contains a graph of the evaporation rate for glycerol a function of temperature and atmospheric saturation ratio.

The use of glycerol allows a loosening (as compared to prior art solvents) of the required atmospheric control during deposition and/or gelation. This is because, that even though saturation should still preferably be avoided, the atmospheric solvent concentration can be lowered without excessive evaporation. FIG. 2 shows how the evaporation rate of glycerol varies with temperature and atmospheric solvent concentration. It has been our experience that, with glycerol, acceptable gels can be formed by depositing and gelling in an uncontrolled or a substantially uncontrolled atmosphere. In this most preferred approach, (a substantially uncontrolled atmosphere) atmospheric controls, if any, during deposition and gelation are typically limited to cleanroom temperature and humidity controls, although the wafer and/or precursor sol may have independent temperature controls.

One attractive feature of using glycerol as a solvent is that at ambient temperature, the evaporation rate is sufficiently low so that several hours at ambient conditions will not yield dramatic shrinkage for thin films. It has been our experience that with glycerol, acceptable gels can be formed by depositing, gelling, and aging in an uncontrolled or a substantially uncontrolled atmosphere. With glycerol, the ambient temperature evaporation rate is sufficiently low so that several hours at ambient conditions will not yield dramatic shrinkage for thin films. It has also been our experience that with ethylene glycol, acceptable gels can be formed by depositing, and gelling an uncontrolled or a substantially uncontrolled atmosphere. With ethylene glycol, the ambient temperature evaporation rate is higher than glycerol, but still sufficiently low so that several minutes at ambient conditions will not yield dramatic shrinkage for thin films. However, the ethylene glycol-based sols have significantly lower viscosities than comparable glycerol-based sols, thus simplifying deposition. Also, the pore fluids in glycerol-based sols have significantly higher surface tensions than comparable ethylene glycol-based sols, thus making low shrinkage drying more difficult.

In addition to serving as a low vapor pressure and water-miscible solvent, ethylene glycol and glycerol may also participate in sol-gel reactions. Although the exact reactions in this process have not been fully studied, some reactions can be predicted. If tetraethoxysilane (TEOS) is employed as a precursor, ethylene glycol can exchange with the ethoxy groups:

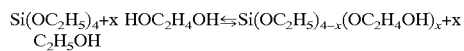

Similarly, if tetraethoxysilane (TEOS) is employed as a precursor with a glycerol solvent, the glycerol can exchange with the ethoxy groups:

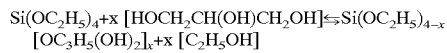

In principle, the presence and concentration of these chemical groups can change the precursor reactivity (i.e., gel time), modify the gel microstructure (surface area, pore size distribution, etc.), change the aging characteristics, or change nearly any other characteristic of the gel.

The use of a new solvent system can change a wide range of processing parameters including gel time, viscosity, aging conditions and drying shrinkage. Many of these properties such as gel times are difficult to measure on thin films. Although bulk and thin film properties may be different, it is often useful to perform a series of experiments on bulk samples (e.g. approximately 5 mm diameter by 30 mm long) to provide a better understanding of how changing solvent systems affects the nanoporous silica process.

Glycerol can react with TEOS and produce a dried gel with surprisingly different properties than that of an ethanol/

TEOS gel. Unanticipated property changes in the glycerol/ TEOS based gels generally include (at least on most formulations):

Lower density is achievable without supercritical drying or pre-drying surface modification Greatly simplified aging Shorter gel times even without a catalyst Strengths of bulk samples which are approximately an order of magnitude greater (at a given density) than conventional TEOS gels Very high surface area (~1,000 m$^2$/g)

High optical clarity of bulk samples (This is likely due to a narrow pore size distribution)

Figure 3:
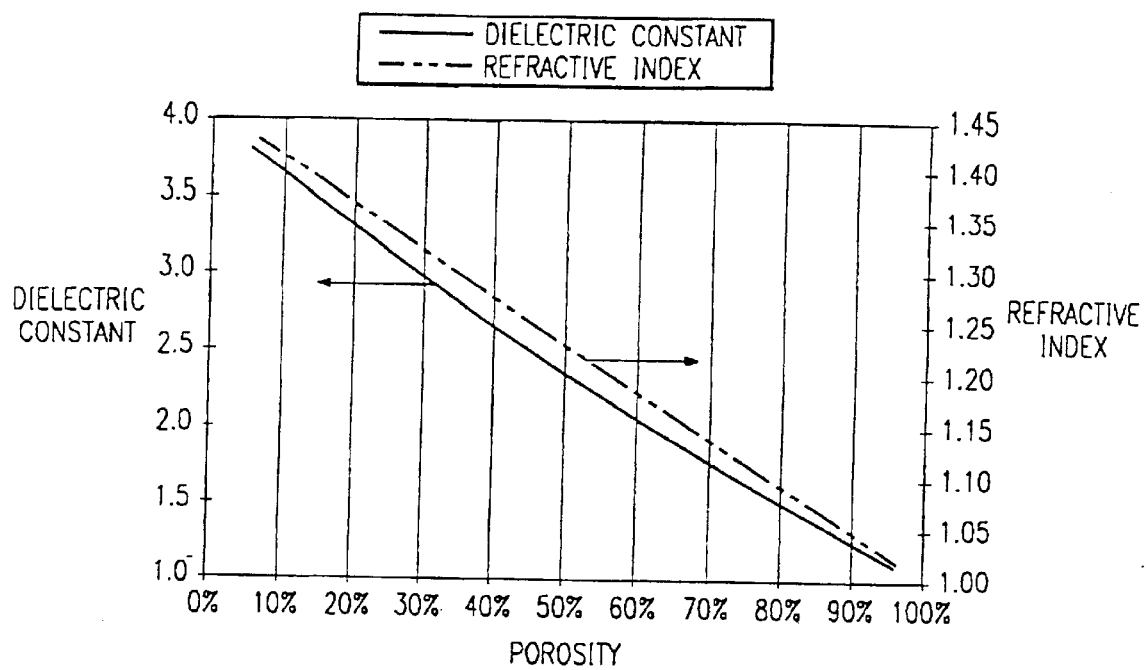
FIG. 3 contains a graph of the theoretical relationship between porosity, refractive index, and dielectric constant for nanoporous silica dielectrics.

Low density—With this invention, it is possible to form dried gels at very low densities without pre-drying surface modification or supercritical drying. These low densities can generally be down around 0.3 to 0.2 g/cm$^3$ (non-porous SiO$_2$ has a density of 2.2 g/cm$^3$), or with care, below 0.1 g/cm$^3$. Stated in terms of porosity (porosity is the percentage of a structure which is hollow), this denotes porosities of about 86% and 91% (about 95% porosity with a density of 0.1 g/cm$^3$). As shown in FIG. 3, these porosities correspond to dielectric constants of about 1.4 for the 86% porous, and 1.2 for 91% porous. The actual mechanism that allows these high porosities is not fully known. However, it may be because the gels have high mechanical strength, because the gels do not have as many surface OH (hydroxyl) groups, a combination of these, or some other factors. This method also seems to obtain excellent uniformity across the wafer.

If desired, this process can be adjusted (by varying the TEOS/solvent ratios) to give any porosity from above 90% down to about 50%. Typical prior art dried gels with small pore sizes required either supercritical drying or a surface modification step before drying to achieve these low densities. While some prior art xerogels have porosities greater than 50%; these prior art xerogels had substantially larger pore sizes (typically above 100 nm). These large pore size gels have significantly less mechanical strength. Additionally, their large size makes them unsuitable for filling small (typically less than 1 µm) patterned gaps on a microcircuit. If desired, this process can also be adjusted (by varying the TEOS/solvent ratios) to provide porosities below 50%. Porosities down to 20% are possible when care is taken to prevent premature gelation.

Thus, this invention has enabled a new, simple nanoporous low density dielectric fabrication method. This new glycerol-based method allows both bulk and thin film aerogels to be made without supercritical drying, or a surface modification step before drying. Prior art aerogels have required at least one of these steps to prevent substantial pore collapse during drying.

Density Prediction—By varying the ratio of glycerol to silicon (or other metal), the density after drying can be accurately predicted. This accuracy is likely due to the well controlled evaporation allowed by the low volatility glycerol solvent. As our process shows excellent shrinkage control during aging and drying, this allows accurate prediction of the density (and thus porosity) of the dried gel. Although density prediction had not generally been considered a large problem with bulk gels, it had typically been difficult to predict the final porosity of thin film gels. This accurate density prediction, even for low porosity dried gels, is one reason why this new process might be preferred over existing xerogel processes for forming low porosity gels.

Simplified Aging—We have found that in the production of nanoporous dielectrics it is preferable to subject the wet gel thin film to a process known as aging. Hydrolysis and condensation reactions do not stop at the gel point, but continue to restructure, or age, the gel until the reactions are purposely halted. It is believed that during aging, preferential dissolution and redeposition of portions of the solid structure produce beneficial results. These beneficial results include higher strength, greater uniformity of pore size, and a greater ability to resist pore collapse during drying. However, aging a wet gel in thin film form is difficult, as the film contains an extremely small amount of pore fluid that should be held fairly constant for a period of time in order for aging to occur. If pore fluid evaporates from the film before aging has strengthened the network, the film will tend to densify in xerogel fashion. On the other hand, if excess pore fluid condenses from the atmosphere onto the thin film before the network has been strengthened, this may locally disrupt the aging process and cause film defects.

Our new, glycerol-based process has radically simplified aging of thin film nanoporous dielectrics. Other thin film nanoporous dielectric aging processes have either allowed significant evaporation, fluid condensation, or required a controlled aging atmosphere. During deposition and gelation, at least to some degree, these glycerol-based processes behave similarly to the ethylene glycol-based processes described below. However, the ethylene glycol-based gels typically require atmospheric controls to prevent significant evaporation during aging, even at room temperature. In contrast, the glycerol-based gels have dramatically lower evaporation and shrinkage rates during aging. This allows atmospheric control to be loosened or eliminated during aging. We can fabricate high quality, thin film, glycerol-based nanoporous dielectrics with only passive atmospheric controls during room temperature or high temperature aging.

Figure 4:
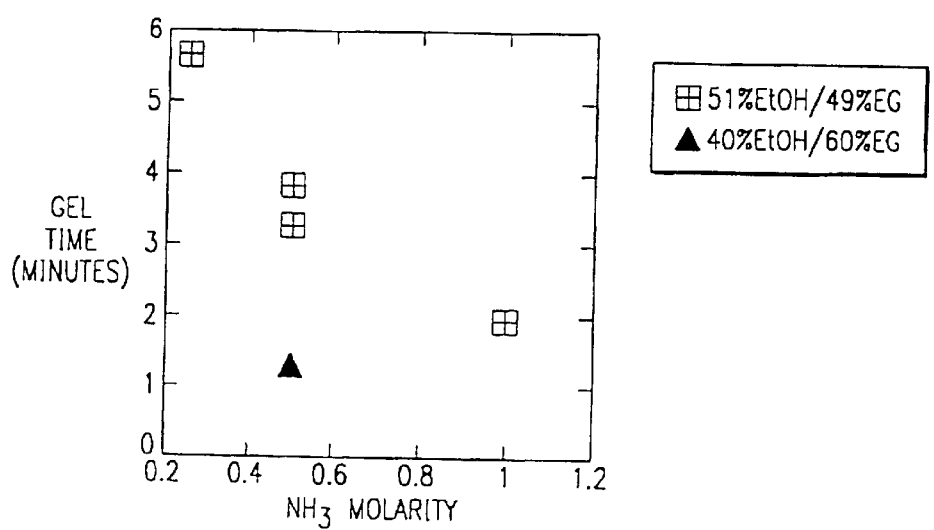
FIG. 4 contains a graph of the change in gel times (without solvent evaporation) for bulk ethylene glycol-based gels as a function of base catalyst FIG. 5 contains a graph of the variation of modulus with density for a non-glycol-based gel and an ethylene glycol-based gel.

Shorter Gel Times—The use of glycerol also substantially shortens the gel time. Many typical ethanol-based precursors have gel times of at least 400 seconds, when catalyzed (much longer w/o catalysis). However, we discovered that some glycerol-based precursors will gel during wafer spin-on, even without catalysis. This quick gelation is not only faster than an ethanol-based gel, but also surprisingly faster than an ethylene glycol-based gel. FIG. 4 shows gel times for two different ethylene glycol-based compositions as a function of the amount of ammonia catalyst used. These gel times are for bulk gels for which there is no evaporation of ethanol and/or water as there would be for thin films. Evaporation increases the silica content and thus, decreases the gel time. Therefore, these gel times may be the upper limit for a given precursor/catalyst. The gel times reported in FIG. 4 are approximately an order of magnitude shorter than conventional ethanol-based precursors. Gel times generally also exhibit a first order dependence on the concentration of ammonia catalyst. This implies that it may be possible to easily control the gel times.

For thin films of these new glycerol-based gels, it is routine to obtain gelation within seconds, even without a gelation catalyst. We have identified several mechanisms that can be used to launch gelation in thin films, without the addition of a catalyst. One method is the concentration of the precursor sol by allowing a volatile solvent to evaporate. Another method is increasing the pH by allowing an acid in the precursor sol to evaporate. This evaporative basification relies on increasing the precursor sol pH to help initiate gelation. However, this basification process does not typically require a pH change from below 7 to above 7. This evaporative basification acts similarly to a typical base catalysis process, greatly speeding gelation. At room temperature and pressure, some acids, such as nitric acid, have evaporation rates comparable to ethanol. Varying the concentrations and/or types of the high volatility solvent(s) and/or stabilizing acid provides a simple, yet tremendous flexible method for adjusting the gelation time.

Figure 5:
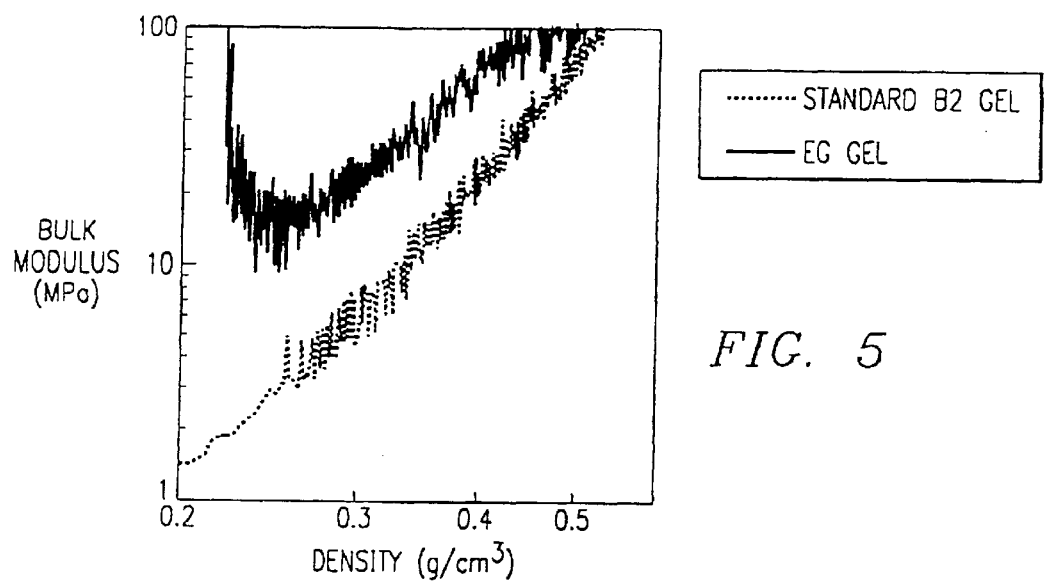

Higher Strength—The properties of the glycerol-based samples appear to be quite different from regular gels as evidenced by both their low degree of drying shrinkage and differences in qualitative handling of the wet and dry gels. Thus, upon physical inspection, the glycerol-based dried gels seem to have improved mechanical properties as compared to both conventional and ethylene glycol-based dried gels. FIG. 5 shows the bulk modulus measured during isostatic compaction measurements of one sample prepared using one ethylene glycol-based and one conventional ethanol-based dried bulk gel (both have the same initial density). After initial changes attributed to buckling of the structure, both samples exhibit power law dependence of modulus with density. This power law dependence is usually observed in dried gels. However, what is surprising is the strength of the ethylene glycol-based dried gel. At a given density (and thus, dielectric constant), the modulus of this sample of the ethylene glycol dried gel is an order of magnitude higher than the conventional dried gel. Preliminary evaluations show that the glycerol-based gels are even stronger than the ethylene glycol-based gels. These evaluations include qualitative handling tests and information based on the shrinkage during drying. The reasons for this strength increase are not totally clear. However, preliminary experiments indicate that our rapid gelation times and/or narrow pore size distribution may be responsible for the high strengths.

High Surface Area—We measured the surface areas of some dried bulk gels. These surface areas were on the order of 1,000 m$^2$/g, as compared to our typical ethanol-based dried gels which have surface areas in the 600–800 m2 /g range. These higher surface areas may imply smaller pore size and improved mechanical properties. It is unclear at this time why these higher surface areas are obtained with the glycerol-based dried gels.

Figure 6:
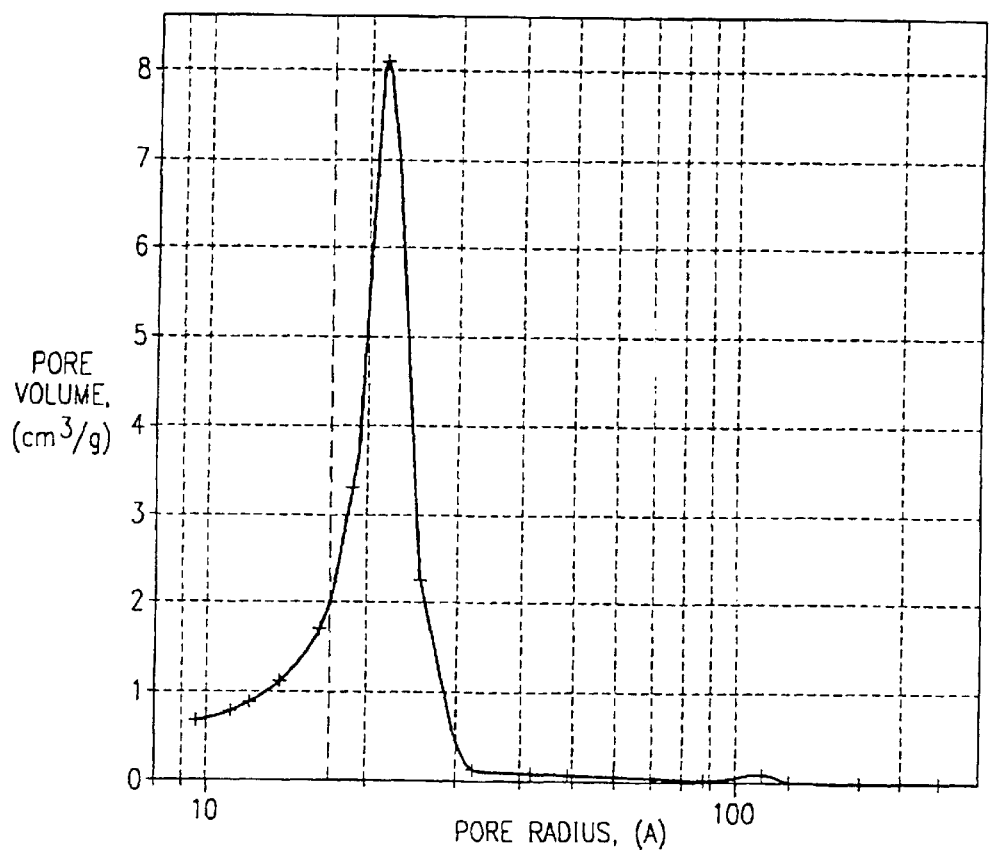
FIG. 6 contains a graph showing the distribution of pore sizes of a bulk glycerol-based nanoporous dielectric according to the present invention.

Pore Size Distribution—The optical clarity of these dried bulk gels was greater than any ethanol-based dried gels at this density that we have previously made. It is possible that this excellent optical clarity is due to a very narrow pore size distribution. However, it is unclear why the glycerol has this effect. Preliminary experiments show that one possible explanation is that rapid gelation times may be linked to a narrow pore size distribution. FIG. 6 shows the pore size distribution (as measured by BJH nitrogen desorption measurements) of a bulk gel sample with a density of about 0.57 g/cm$^3$. The mean pore diameter (desorption method) of this sample was 3.76 nm. As the typical pores are not truly cylindrical, diameter, as used herein, actually refers to the diameter of an equivalent cylinder with the same surface area to volume ratio as the overall gel's surface area to volume ratio.

As shown above, some properties of the glycerol-based gels apply to both bulk gels and thin films. However, some advantages are most evident when applied to thin films, such as nanoporous dielectric films on semiconductor wafers. One important advantage is that this new method allows high quality nanoporous films to be processed with no atmospheric controls during deposition or gelation.

Although it is important to be able to deposit and gel thin nanoporous films without atmospheric controls, it is also desirable to age thin nanoporous films without atmospheric controls. It has been discovered that this can present a bigger challenge than deposition. The primary reason is that while deposition and room temperature gelation can take place in minutes, or even seconds; room temperature aging typically requires hours. Thus, an evaporation rate that provides acceptable shrinkage for a short process, may cause unacceptable shrinkage when the process times are lengthened by an order of magnitude.

Figure 7:
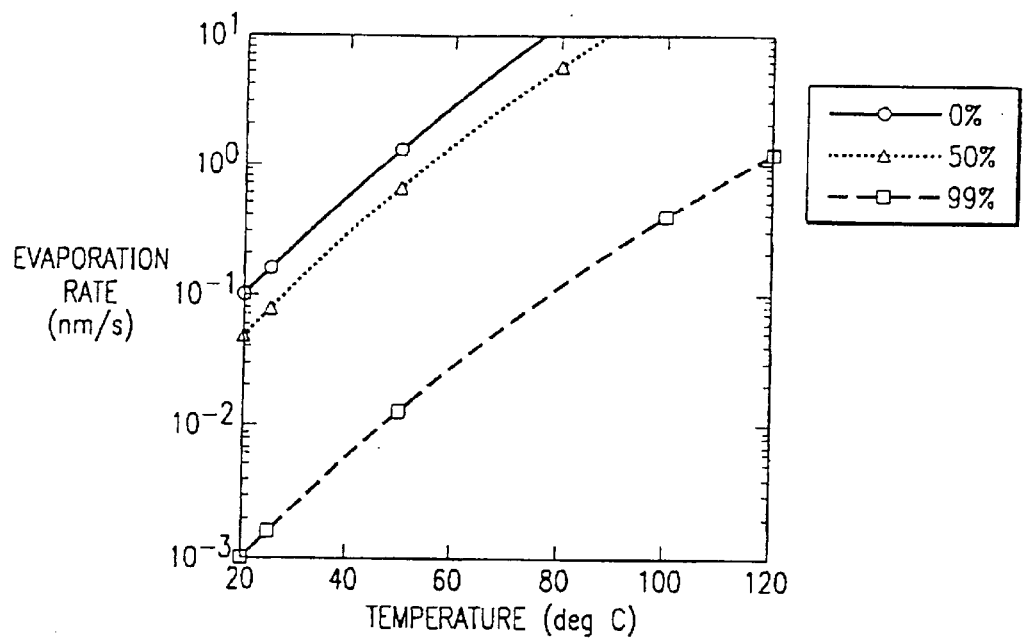
FIG. 7 contains a graph of the evaporation rate for ethylene glycol as a function of temperature and atmospheric saturation ratio.

As an example, we have found that with some glycerol-based gels, a satisfactory aging time at room temperature is on the order of a day. However, Table 1 shows that, by using higher temperatures, we can age thin films with times on the order of minutes. These aging times are comparable to the preferred aging time of many typical ethanol-based and ethylene glycol-based gels. Thus, when these times and temperatures are combined with the evaporation rates of FIG. 1, FIG. 7, and FIG. 2, they give the approximate thickness loss during aging as shown in Table 2. These estimated thickness losses need to be compared with acceptable thickness losses, particularly for thin film applications. While no firm guidelines for acceptable thickness loss exist, one proposed guideline, for some microcircuit applications such as nanoporous dielectrics, is that the thickness losses should be less than 2% of the film thickness. For a hypothetical nominal film thickness of 1 $\mu$m (Actual film thicknesses may typically vary from significantly less than 0.5 $\mu$m to several $\mu$m thick), this gives an allowable thickness loss of 20 nm. As shown in Table 2, the glycerol-based gels can achieve this preliminary goal without atmospheric control at room temperature. Thus, this invention allows controlled porosity thin film nanoporous aerogels to be deposited, gelled, aged, and dried without atmospheric controls. In another aspect, this invention allows controlled porosity thin film nanoporous aerogels to be deposited, gelled, rapidly aged at an elevated temperature, and dried with only passive atmospheric controls, such as limiting the volume of the aging chamber.

TABLE 1

Approximate Aging Time as a Function of Temperature For Some Thin Film Glycerol-Based Gels

| Aging Temperature (Degrees C.) | Aging Time For Glycerol-Based Gels (Order of Magnitude Approximations) |
| --- | --- |
| 25 | 1 day |
| 100 | 5 minutes |
| 140 | 1 minute |

TABLE 2

Approximate Thickness Loss During Aging vs. Saturation Ratio.

| Aging Time/ Temp- erature | Thickness Loss During Aging | | | | | | | | |
| --- | --- | --- | --- | --- | --- | --- | --- | --- | --- |
| | Ethanol-Based Gel % Saturation | | | EG-Based Gel % Saturation | | | Glycerol-Based Gel % Saturation | | |
| | 0% | 50% | 99% | 0% | 50% | 99% | 0% | 50% | 99% |
| 1 day/ 25° C. | 8 mm | 7 mm | 86 $\mu$m | 17 $\mu$m | 7 $\mu$m | 172 nm | 13 nm | 5 nm | .1 nm |
| 300 sec/ 100° C. | — | — | — | 3 $\mu$m | 1.2 $\mu$m | 90 nm | 600 nm | 420 nm | 9 nm |
| 60 sec/ 140° C. | — | — | — | — | — | — | 6 $\mu$m | 3 $\mu$m | 60 nm |

Figure 8:
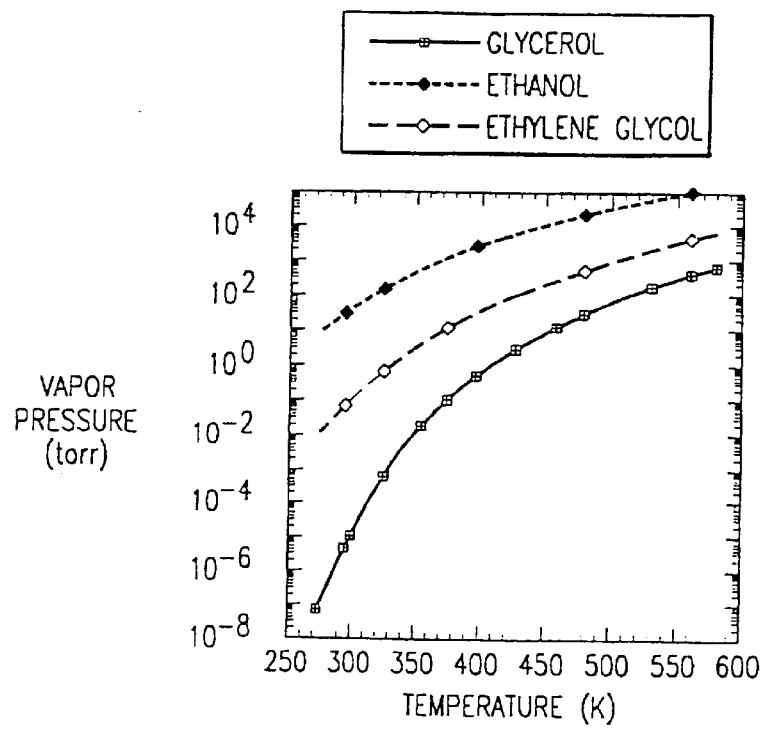
FIG. 8 contains a graph showing the change in vapor pressure with temperature.
Figure 9:
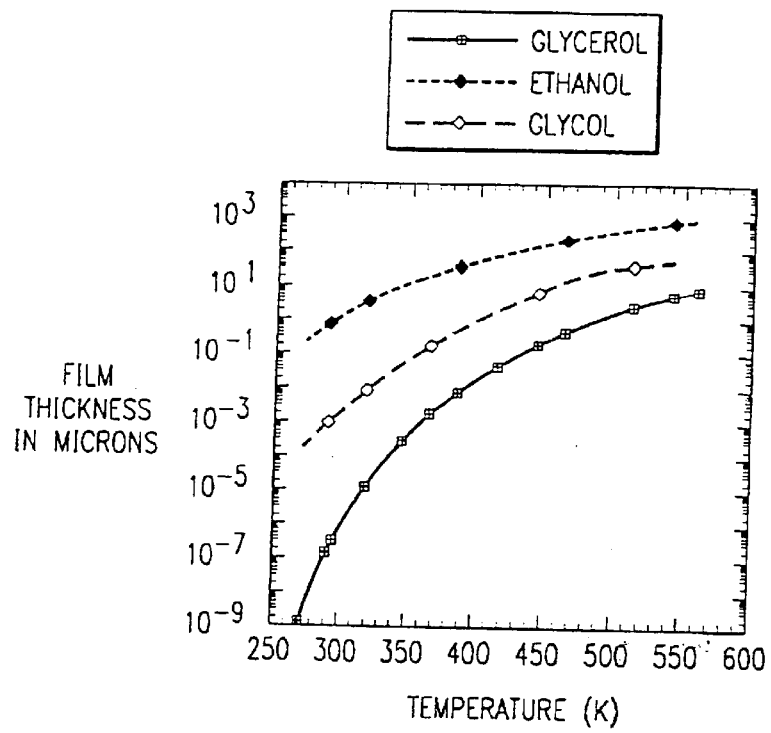
FIG. 9 contains a graph showing the shrinkage of a thin film when dried in a 5 mm thick container.
Figure 10:
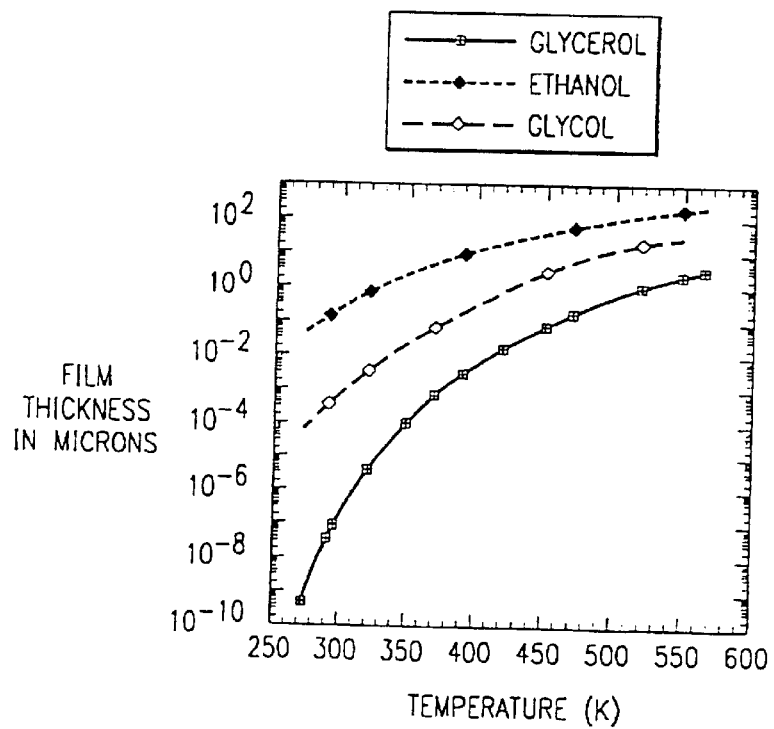
FIG. 10 contains a graph showing the shrinkage of a thin film when dried in a 1 mm thick container.

Improved yield and reliability considerations may require thickness losses below 2%, such as less than 0.5% or 0.1%. By using passive atmospheric control, this invention can be extended to these, and even lower evaporation losses. This passive control involves placing the gel in a relatively small closed container, at least during aging. In this aspect of the invention, evaporation from the wafer acts to raise the saturation ratio of the atmosphere inside the closed container. At any given temperature, this evaporation continues until the partial pressure of the vapor increases enough to equal the vapor pressure of the liquid. Thus, solvent/temperature combinations with lower vapor pressure will not allow as much liquid solvent to evaporate as a higher vapor pressure combination allows. FIG. 8 shows how vapor pressure varies with temperature for several solvents. If the container size is known, the amount of evaporation can be calculated. FIG. 9 shows an estimate of how thick of layer of solvent could potentially be evaporated if a 70% porous gel is placed in a 5 mm high cylindrical container that is the same diameter as the wafer. FIG. 10 shows a similar estimate for a container with a 1 mm high airspace above the wafer. These figures show that, with a 5 mm high airspace, the 20 nm preliminary goal is feasible up to 120 degrees C. for glycerol-based gels, but only up to 50 degrees C. for ethylene glycol-based gels. With the 1 mm airspace, the 20 nm goal is feasible all the way up to 150 degrees C. for the glycerol-based gels, but only up to 80 degrees C. for the ethylene glycol-based gels. Of course, lower temperature processing allows less evaporation. Passive evaporation control using the 1 mm containers allows less than 1 nm of thickness loss (0.1% of a 1 μm thick film) for the glycerol-based gels, even at 100 degrees C.

There are many variations on this passive control approach. One variation allows the container size to increase. The thickness loss will linearly increase with the container volume. However, even a 1000 cubic centimeter container typically allows only 5 nm of glycerol evaporation at 80 degrees C. Another variation is the gel porosity. Higher porosity gels generally experience greater thickness losses while lower porosity gels generally experience slightly smaller thickness losses.

Figure 11A:
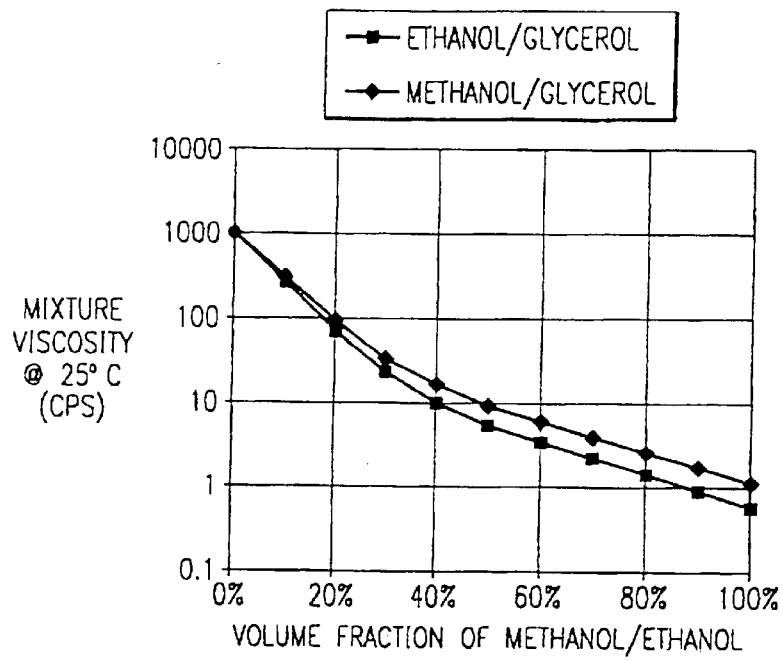
FIGS. 11A–11B contain graphs of the viscosity variation as a function of alcohol volume fraction for some ethylene glycol/alcohol and glycerol/alcohol mixtures.
Figure 11B:
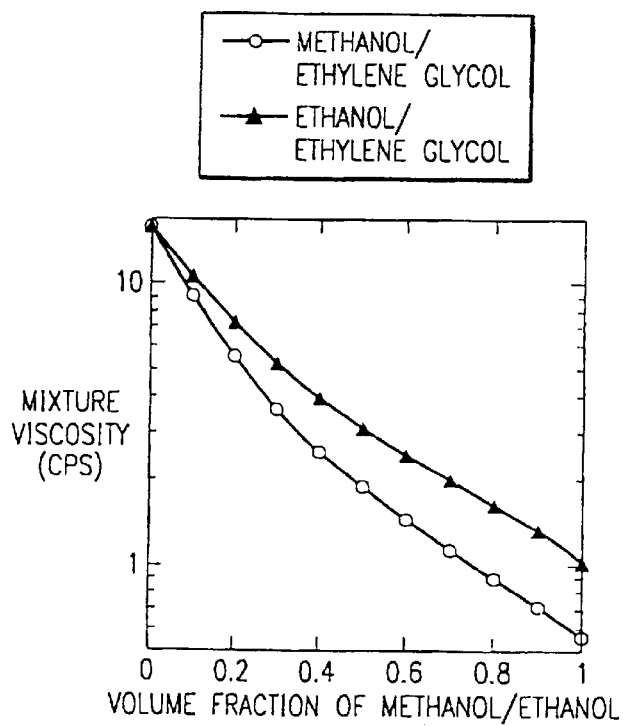

One disadvantage of glycerol is its relatively high viscosity which can cause problems with gap-filling and/or planarization. As described above, a low viscosity, high volatility solvent can be used to lower the viscosity. FIG. 11A shows the calculated viscosity of some ethanol/glycerol and methanol/glycerol mixtures at room temperature. As the figure shows, alcohol can significantly reduce the viscosity of these mixtures. FIG. 11B shows the calculated viscosity of some ethanol/ethylene glycol and methanol/ethylene glycol mixtures at room temperature. As this figure shows, the ethylene glycol is much less viscous than the glycerol, and small quantities of alcohol significantly reduce the viscosity of these mixtures. Also, if the viscosity using ethanol in the stock solution is higher than desired, further improvement can be realized by employing methanol in the precursor solution. The viscosities reported in FIGS. 11A–11B are for pure fluid mixtures only. In fact, depending upon the film precursor solution, the precursor solution might contain glycerol, alcohol, water, acid and partially reacted metal alkoxides. Of course, the viscosity can be increased before deposition by catalyzing the condensation reaction and hence, the values reported in FIGS. 11A–11B represent lower bounds.

This multi-solvent approach may be combined with or replaced by an alternative approach. This alternate approach use elevated temperatures to reduce the sol viscosity during application. By heating and/or diluting the precursor during deposition, (such as by heating the transfer line and deposition nozzle of a wafer spin station) the viscosity of the precursor sol can be substantially lowered. Not only does this preheat lower the sol viscosity, it will also speed gel times and accelerate the evaporation of any high volatility solvents. It may also be desirable to preheat the wafer. This wafer preheat should improve process control and may improve gap fill, particularly for the more viscous precursors. However, for many applications, wafer preheat is not required, thus simplifying process flows. When using a spin-on application method with this no wafer preheat approach, the spin station would not require a temperature controlled spinner.

Dried gels produced with this simple thin film aerogel fabrication process can be used in many applications. Some of these uses may not have been cost effective using prior art methods. These uses include low dielectric constant thin films (particularly on semiconductor substrates), miniaturized chemical sensors, thermal isolation structures, and thermal isolation layers (including thermal isolation structures for infrared detectors). As a general rule, many low dielectric constant thin films prefer porosities greater than 60%, with critical applications preferring porosities greater than 80 or 90%, thus giving a substantial reduction in dielectric constant. However, structural strength and integrity considerations may limit the practical porosity to no more than 90%. Some applications, including thermal isolation structures and thermal isolation layers, may need to sacrifice some porosity for higher strength and stiffness. These higher stiffness requirements may require dielectrics with porosities as low as 30 or 45%. In other high strength/toughness applications, especially sensors, where surface area may be more important than density, it may be preferable to use a low porosity gel with a porosity between 20% and 40%.

The thin film discussion above has centered around thin film aerogels for microelectronic circuits. However, aerogels are also useful in other applications, such as thin films on passive substrates. These new high strength, easy to fabricate gels now make many of these uses practical. For purposes of this application, a passive substrate is defined as a substrate that does not comprise or contain a microelectronic circuit, or at least where there is no interaction between the aerogel and the electronics. Sol-Gel Science by C. J. Brinker and G. W. Scherer describes several of these uses in chapter 14. These passive uses may partially include some types of optical coatings, some types of protective coatings, and some types of porous coatings.

Antireflective (AR) coatings can require a wide range of porosities. These will typically range from 20% porous to 70% porous, although higher porosities (above 90%) may be useful where there is adequate surface protection, and lower porosities (down to 10%, or below) may be useful in high performance coatings or coatings on substrates with a high index of refraction. In some single layer AR coatings, it may be preferable to use gels with porosities between 30% and 55%. Higher performance, multi-layer AR coatings will prefer denser layers (e.g., porosity between 10% and 30%) next to the substrate, and less dense layers (e.g., porosity between 45% and 90%) next to the air interface. For higher strength/toughness applications, especially where high strength and surface area are the primary goals, it may be preferable to use a low porosity gel with a porosity between 20% to 40%. Other thin film coatings may need the lowest density practical, thus needing porosities greater than 85%, 90%, or even 95%.

There are also many bulk gel applications that can benefit from these new high strength, easy to fabricate aerogels. These bulk gel uses include (but are not limited to) nanoporous (e.g., molecular) sieves, thermal insulation, catalyst supports, adsorbents, acoustic insulation, and optiseparation membranes. As a general rule, many bulk uses prefer porosities greater than 60%, with critical applications preferring porosities greater than 80% or 90%. However, structural strength and integrity considerations may limit the practical porosity to no more than 95%. Some applications, possibly including sieves, may need to sacrifice some porosity for higher strength and stiffness. These higher stiffness requirements may require dielectrics with porosities as low as 30 or 45%. In other high strength/toughness applications, possibly including catalyst supports and sensors, where surface area may be more important than density, it may be preferable to use a low porosity gel with a porosity between 20% and 40%.

Typical sol-gel thin film processes produce gels which collapse and densify upon drying, thus forming xerogels having limited porosity (Up to 60% with large pore sizes, but generally substantially less than 50% with pore sizes of interest). Under the uncontrolled drying conditions of xerogel film formation, many of the internal pores permanently collapse. However, in thin film aerogel formation, the pores remain substantially uncollapsed, even though there may be a small amount of shrinkage during aging and/or drying that affects the final density.

Figure 12A:
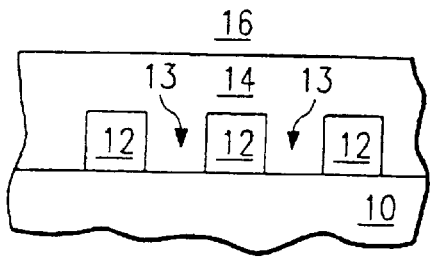
FIGS. 12A–12B contain cross-sections of a semiconductor substrate at several points during deposition of a thin film according to the present invention.

Referring now to FIG. 12A, a semiconductor substrate 10 (typically in wafer form) is shown. Common substrates include silicon, germanium, and gallium arsenide, and the substrate may include active devices, lower level wiring and insulation layers, and many other common structures not shown but known to those skilled in the art. Several patterned conductors 12 (e.g., of an Al-0.5%Cu composition) are shown on substrate 10. Conductors 12 typically run parallel for at least part of their length, such that they are separated by gaps 13 of a predetermined width (typically a fraction of a micron). Both the conductors and gaps may have height-to-width ratios much greater than shown, with larger ratios typically found in devices with smaller feature sizes.

Figure 12B:
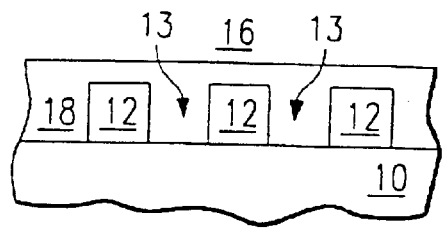

In accordance with a first embodiment of the present invention, mix 61.0 mL tetraethoxysilane (TEOS), 61.0 mL glycerol, 4.87 mL water, and 0.2 mL 1M $HNO_3$ and reflux for 1.5 hours at ~60° C. to form a stock solution. Equivalently, mix 0.27 mol TEOS, 0.84 mol glycerol, 0.27 mol water, and 2.04E-4 mol $HNO_3$ and reflux for 1.5 hours at ~60° C. After the stock solution is allowed to cool, the solution may be diluted with ethanol to reduce the viscosity. One suitable stock solution:solvent volume ratio is 1:8. However, this ratio will depend upon desired film thickness, spin speed, and substrate. This is mixed vigorously and typically stored in a refrigerator at ~7° C. to maintain stability until use. The solution is typically warmed to room temperature prior to film deposition. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in an atmosphere that has no special control of solvent saturation (e.g., in a cleanroom with non-exotic humidity controls). During and after this deposition and spinning, the ethanol, water, and the nitric acid are evaporating from film 14, but due to glycerol's low volatility, no substantial evaporation of the glycerol is occurring. This evaporation temporarily cools the thin film, although the film temperature rises within seconds after the evaporation rate drops off. This cooling retards, but does not prevent gelation. This evaporation also shrinks thin film 14 and concentrates the silica content of the sol, forming reduced thickness film 18. FIG. 12B shows a reduced thickness sol film 18 obtained after substantially all (about 95% or more) of the ethanol has been removed. This concentrating, evaporative basification, and/or rewarming of the film typically cause gelation within seconds.

Film 18 has an approximately known ratio of silicon to pore fluid at the gel point. This ratio is approximately equal to the ratio of TEOS to glycerol in the as-deposited sol (with minor changes due to remaining water, continued reactions and incidental evaporation). As this method largely prevents the gel from permanently collapsing, this ratio determines the density of the aerogel film that will be produced from the sol thin film.

After gelation, the thin film wet gel 18 comprises a porous solid and a pore fluid, and can preferably be allowed time to age at one or more controlled temperatures, e.g., about a day at room temperature. It should be noted that the pore fluid changes somewhat during processing. These changes may be due to continued reactions, evaporation/condensation, or chemical additions to the thin film. Aging may preferably be accomplished by letting the substrate and gel sit for approximately 24 hours at about 25° C. or by heating it to 130–150° C. for about 1 minute in a closed container.

Aged film 18 may be dried without substantial densification by one of several methods, including supercritical fluid extraction. However, with these new glycerol-based gels, one alternative is to use a solvent exchange to replace the aging fluid with a drying fluid and then air dry the film 18 from this drying fluid. This drying method uses a solvent exchange to replace the aging fluid with a different fluid. Whether this fluid is identical to the aging fluid or not, the pore fluid that is present during drying is sometimes referred to as "drying fluid". If used, the solvent exchange replaces the aging fluid that is dominated by the glycerol and its associated high surface tension with a drying fluid that has a lower surface tension. This solvent exchange may be carried out as a one or two step process. In the two step process, the first step replaces the aging fluid with an intermediate by dispensing approximately 3–8 mL of ethanol at room temperature (or warmer) onto aged thin film 18, then spinning the wafer between approximately 50 and 500 rpm for about 5–10 seconds. It sometimes requires between 3 and 6 spin-on sequences to replace most of the aging fluid. The second step preferably replaces the intermediate fluid with a drying fluid such as heptane. This step preferably comprises dispensing approximately 3–8 mL of heptane at room temperature (or warmer) onto aged thin film 18, then spinning the wafer between approximately 50 and 500 rpm for about 5 10 seconds. It sometimes requires between 3 and 6 spin-on sequences to replace most of the intermediate fluid. This solvent exchange method allows us to remove nearly all the glycerol-containing fluid before drying. The drying fluid (heptane in this case) is finally allowed to evaporate from the wet gel 18, forming a dry nanoporous dielectric (dried gel). If the film can be satisfactorily dried from a liquid that is soluble with the aging fluid, the intermediate may not be required. In many cases, the wet gel can be dried directly from ethanol, or other suitable solvent.

This evaporation may be performed by exposing the wafer surface to an atmosphere that is not near saturated with the drying fluid. For example, the wafer could be in a substantially uncontrolled atmosphere, or a drying gas could be introduced into the atmosphere. To prevent boiling, drying should preferably start at a temperature somewhat below the boiling point of the drying fluid, such as room temperature. If a higher boiling point drying fluid, such as glycerol, is used (e.g., drying without solvent replacement), the starting drying temperature can be increased to a temperature near or equal to the aging temperature. As the thin film becomes predominately dry (typically within seconds), the temperature should then be increased above the boiling point of both the aging fluid and the drying fluid. This method prevents destructive boiling, yet insures that all fluid is removed. Glycerol, as well as some other fluids, either decompose at approximately the same temperature as they boil, or decompose in lieu of boiling. With these fluids, particularly fluids like glycerol that can decompose into toxic substances, care should be taken not to overheat the evaporated fluid or the undried wafer. After drying, it is preferable to bake the nanoporous dielectric for a short time (such as 300° for 15 to 60 minutes) to help remove any residual materials, such as organics, that are in or on the dielectric. The theoretical dielectric constant (before surface modification) of this embodiment is 1.3.

In order to reduce the dielectric constant, it is preferable to dehydroxylate (anneal) the dried gel. This may be done by placing the wafer in a dry atmosphere with an agent, such as hexamethyldisilazane (HMDS) or hexaphenyldisilazane vapor. The HMDS will replace much of the water and/or hydroxyls bound to the dried gel's pore surfaces with methyl groups. This replacement may be performed at room temperature, or warmer. This replacement can not only remove water and/or hydroxyls, it can also render the dried gel hydrophobic (water repelling). The hexaphenyldisilazane will also remove water and/or hydroxyls and render the dried gel hydrophobic. However, the phenyl groups have a higher temperature stability than the methyl groups, at the expense of a slightly higher dielectric constant.

Figure 13:
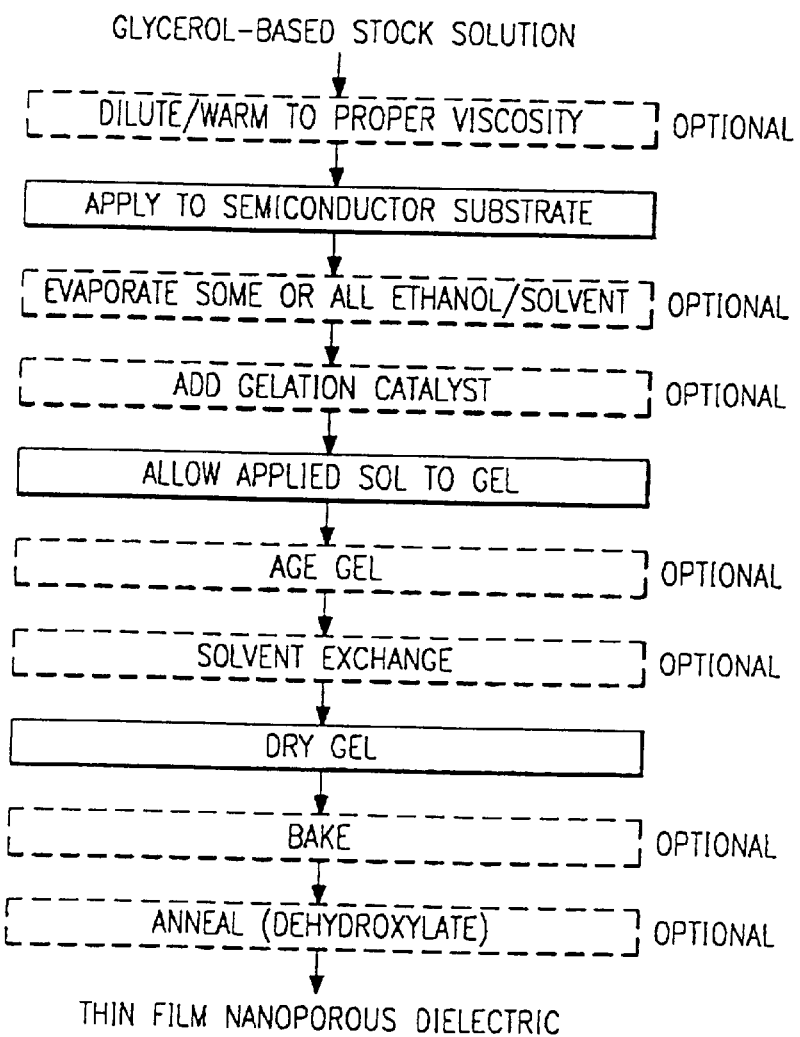
FIG. 13 is a flow chart of a deposition process for a nanoporous dielectric according to the present invention.

FIG. 13 contains a flow chart of a general method for obtaining an aerogel thin film from a precursor sol according to one embodiment of the present invention. Table 3 is a quick summary of some of the substances used in this method.

TABLE 3.

Substance Summary

| Ref # | Specific Example | Functional Description | Preferred Alternates |
|---|---|---|---|
| 10 26 | Silicon | Substrate | Semiconductor subst. rate, Ge, GaAs, active devices, lower level layers, glass, plastic, optical substrate |
| 12 | Al—0.5% Cu | Patterned Conductors | Al, Cu, other metals, polysilicon |
|  | TEOS | Precursor Sol Reactant | Other silicon-based metal alkoxides (TMOS, MTEOS, BTMSE, etc.), alkoxides of other metals, particulate metal oxides, organic precursors, and combinations thereof |
|  | Glycerol | Precursor Sol First Solvent (Low volatility) | Ethylene glycol, Other trihydric alcohols, combinations of glycerol and dihydric and/or trihydric alcohols. 1,4-butylene glycol and 1,5-pentanediol. 1,2,4-butane-triol; 1,2,3-butanetriol; 2 methyl-propane-triol; and 2-(hydroxymethyl)-1,3-propane-diol; 1-4, 1-4,butanediol; and 2-methyl-1,3-propanediol. |
|  | Nitric Acid ($HNO_3$) | Precursor Sol Stabilizer | Other acids |
|  | Ethanol | Precursor Sol Second Solvent (High volatility) | Methanol, other alcohols |
|  | Ethanol | Viscosity Reduction Solvent | Methanol, other alcohols |
|  | Ammonium Hydroxide ($NH_4OH$) | Gelation Catalyst | Ammonia, volatile amine species, volatile fluorine species, and other compounds that will raise the pH of the deposited sol. |
|  | As-Gelled Pore Fluid | Aging Fluid | Glycerol, ethylene glycol, water, ethanol, other alcohols, combinations thereof. |
|  | Aging fluid | Drying Fluid | Heated aging fluid, heptane, acetone, isoproponal, ethanol, methanol, 2-ethylbutyl alcohol, alcohol/water mixtures, ethylene glycol, other liquids that are miscible with the aging fluid, yet have lower surface tension than the aging fluid, combinations thereof. |
|  | Hexa-methyldi-silazane (HMDS) | Surface Modification Agent | hexaphenyldisilazane, trimethyl-methoxysilane, dimethyldimethoxysilane, trimethylchlorosilane (TMCS), phenyl compounds and fluorocarbon compounds. |

In accordance with a second, higher density, embodiment of the present invention, mix 150.0 mL TEOS, 61.0 mL glycerol, 150.0 mL ethanol, 12.1 mL water, and 0.48 mL 1M $HNO_3$ and reflux for 1.5 hours at ~60° C. to form a stock solution. Equivalently, mix 0.67 mol TEOS, 0.84 mol glycerol, 2.57 mol ethanol, 0.67 mol water, and 4.90E-4 mol $HNO_3$ and reflux for 1.5 hours at ~60° C. After the stock solution is allowed to cool, the solution may be diluted with ethanol to reduce the viscosity. One suitable stock solution-:solvent volume ratio is 1:8. This is mixed vigorously and typically stored in a refrigerator at ~7° C. to maintain stability until use. The solution is warmed to room temperature prior to film deposition. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in an atmosphere that is not solvent controlled (e.g., standard exhausts in a cleanroom with non-exotic humidity controls). During and after this deposition and spinning, ethanol (a viscosity reduction additive and a reaction product from the TEOS and water) and water is evaporating from film 14, but due to glycerol's low volatility, no substantial evaporation of the glycerol is occurring. This evaporation shrinks thin film 14 and concentrates the silica content of the sol forming reduced thickness film 18. FIG. 12B shows a reduced thickness sol film 18 obtained after substantially all (about 95% or more) of the water has been removed. This concentrating typically causes gelation within minutes.

Further processing generally follows the process described in the first embodiment. After gelation, the thin film wet gel 18 comprises a porous solid and a pore fluid, and can preferably be allowed time to age at one or more controlled temperatures. Aged film 18 may be dried without substantial densification by one of several methods, including supercritical fluid extraction. However, with the lower density formulations of these new glycerol-based gels, it is preferable to perform a non-supercritical drying, such as a solvent exchange followed by air drying the film 18 from the drying fluid, as described in the first embodiment. The nanoporous dielectric can then be subjected to a post-dry bake and/or a surface modification, as described in the first embodiment. The theoretical dielectric constant (before surface modification) of this embodiment is 1.6.

In accordance with a third, higher density, embodiment of the present invention, mix 208.0 mL TEOS, 61.0 mL glycerol, 208.0 mL ethanol, 16.8 mL water, and 0.67 mL 1M $HNO_3$ and reflux for 1.5 hours at ~60° C. to form a stock solution. Equivalently, mix 0.93 mol TEOS, 0.84 mol glycerol, 3.56 mol ethanol, 0.93 mol water, and 6.80E-4 mol $HNO_3$ and reflux for 1.5 hours at ~60° C. After the stock solution is allowed to cool, the solution may be diluted with ethanol to reduce the viscosity. One suitable stock solution:solvent volume ratio is 1:8. This is mixed vigorously and typically stored in a refrigerator at ~7° C. to maintain stability until use. The solution is warmed to room temperature prior to film deposition. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in an atmosphere that is not solvent controlled (e.g., standard exhausts in a cleanroom with non-exotic humidity controls). During and after this deposition and spinning, ethanol and water is evaporating from film 14, but due to glycerol's low volatility, no substantial evaporation of the glycerol is occurring. This evaporation shrinks thin film 14 and concentrates the silica content of the sol forming reduced thickness film 18. FIG. 12B shows a reduced thickness sol film 18 obtained after substantially all (about 95% or more) of the water has been removed. This concentrating typically causes gelation within minutes.

Further processing generally follows the process described in the first embodiment. After gelation, the thin film wet gel 18 comprises a porous solid and a pore fluid, and can preferably be allowed time to age at one or more controlled temperatures. Aging may be accomplished by letting the device sit for approximately 24 hours at 25° C. Aged film 18 may be dried without substantial densification by one of several methods, including supercritical fluid extraction, or a solvent exchange followed by air drying. However, especially in this higher density formulation of these new glycerol-based gels, it is preferable to air dry the film 18 from the aging fluid. In this direct drying method, the wafer surface is exposed to an atmosphere that is not near saturated with the drying fluid. A simple method is to remove the cover from a low volume aging chamber, thus exposing the gel surface to a substantially uncontrolled atmosphere. Another method introduces a drying gas into the aging chamber or atmosphere. With this direct drying method, the starting drying temperature can preferably be increased to a temperature near or equal to the aging temperature. This high temperature drying reduces surface tension and associated shrinkage, speeds drying, and simplifies processing. As the thin film becomes predominately dry (typically within seconds for high temperature drying), the temperature should then be increased above the boiling point of both the aging fluid and the drying fluid (they are often the same fluid). This method prevents destructive boiling, yet insures that all fluid is removed. Since this method's drying fluid comprises glycerol, which can decompose into toxic substances, care should be taken not to overheat the evaporated fluid or the undried wafer. The nanoporous dielectric can then be subjected to a post-dry bake and/or a surface modification, as described in the first embodiment. The theoretical dielectric constant (before surface modification) of this embodiment is 1.76.

In accordance with a fourth embodiment of the present invention, mix 278.0 mL TEOS, 61.0 mL glycerol, 278.0 mL ethanol, 22.5 mL water, and 0.90 mL 1M $HNO_3$ and reflux for 1.5 hours at ~60° C. to form a stock solution. Equivalently, mix 1.25 mol TEOS, 0.84 mol glycerol, 4.76 mol ethanol, 1.25 mol water, and 9.1 E-4 mol $HNO_3$ and reflux for 1.5 hours at ~60° C. After the stock solution is allowed to cool, the solution may be diluted with ethanol to reduce the viscosity. One suitable stock solution:solvent volume ratio is 1:8. This is mixed vigorously and typically stored in a refrigerator at ~7° C. to maintain stability until use. The solution is warmed to room temperature prior to film deposition. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in an atmosphere that is not solvent controlled (e.g., standard exhausts in a cleanroom with non-exotic humidity controls). During and after this deposition and spinning, ethanol and water is evaporating from film 14, but due to glycerol's low volatility, no substantial evaporation of the glycerol is occurring. This evaporation shrinks thin film 14 and concentrates the silica content of the sol forming reduced thickness film 18. FIG. 12B shows a reduced thickness sol film 18 obtained after substantially all (about 95% or more) of the water has been removed. This concentrating typically causes gelation within minutes.

Further processing generally follows the process described in the third embodiment. After gelation, the thin film wet gel 18 comprises a porous solid and a pore fluid, and can preferably be allowed time to age at one or more controlled temperatures. Aged film 18 may be dried without substantial densification by one of several methods, including supercritical fluid extraction. However, it is preferable to air dry the film 18 from the aging fluid, as described in the third embodiment. The nanoporous dielectric can then be subjected to a post-dry bake and/or a surface modification, as described in the first embodiment. The theoretical dielectric constant (before surface modification) of this embodiment is 1.96.

In accordance with a fifth embodiment of the present invention, mix 609.0 mL TEOS, 61.0 mL glycerol, 609.0 mL ethanol, 49.2 mL water, and 1.97 mL 1M $HNO_3$ and reflux for 1.5 hours at ~60° C. to form a stock solution. Equivalently, mix 2.73 mol TEOS, 0.84 mol glycerol, 10.4 mol ethanol, 2.73 mol water, and 2.00E-3 mol $HNO_3$ and reflux for 1.5 hours at ~60° C. After the stock solution is allowed to cool, the solution may be diluted with ethanol to reduce the viscosity. One suitable stock solution:solvent volume ratio is 1:8. This is mixed vigorously and typically stored in a refrigerator at ~7° C. to maintain stability until use. The solution is warmed to room temperature prior to film deposition. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in an atmosphere that is not solvent controlled (e.g., standard exhausts in a cleanroom with non-exotic humidity controls). During and after this deposition and spinning, ethanol and water is evaporating from film 14, but due to glycerol's low volatility, no substantial evaporation of the glycerol is occurring. This evaporation shrinks thin film 14 and concentrates the silica content of the sol forming reduced thickness film 18. FIG. 12B shows a reduced thickness sol film 18 obtained after substantially all (about 95% or more) of the water has been removed. This concentrating typically causes gelation within minutes.

Further processing generally follows the process described in the third embodiment. After gelation, the thin film wet gel 18 comprises a porous solid and a pore fluid, and can preferably be allowed time to age at one or more controlled temperatures. Aged film 18 may be dried without substantial densification by one of several methods, including supercritical fluid extraction. However, it is preferable to air dry the film 18 from the aging fluid, as described in the third embodiment. The nanoporous dielectric can then be subjected to a post-dry bake and/or a surface modification, as described in the first embodiment. The theoretical dielectric constant (before surface modification) of this embodiment is 2.5.

Figure 14:
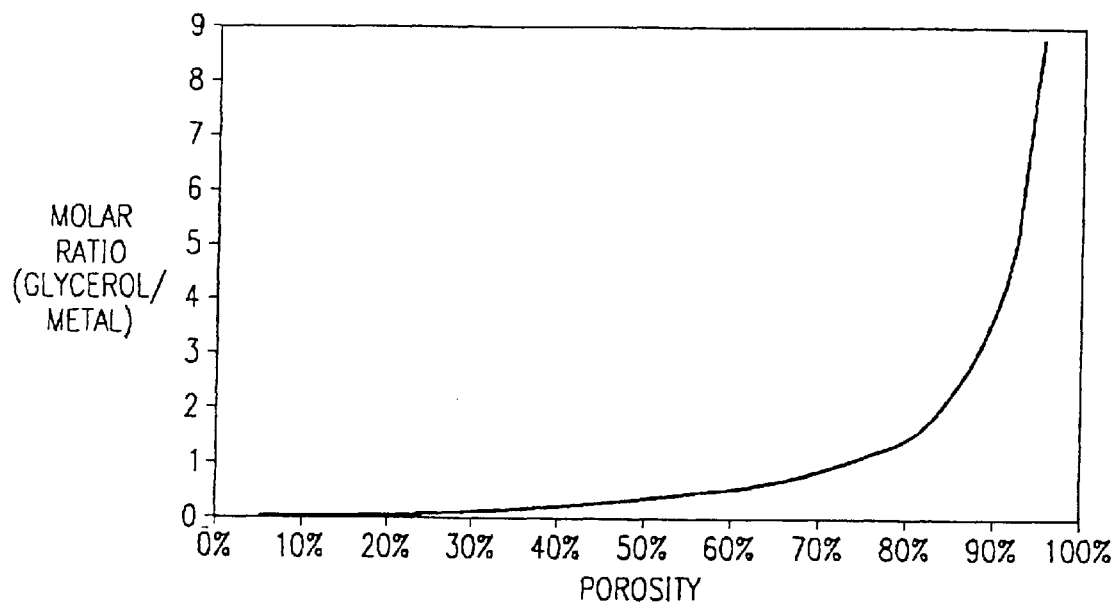
FIG. 14 contains a graph of the theoretical molar ratio of glycerol molecules to metal atoms vs. porosity of a nanoporous dielectric according to the present invention.

Other ratios of solvent to reactant ratios can be used to provide different porosities/dielectric constants. FIG. 14 shows the theoretical relationship between the molar ratio of glycerol molecules to metal atoms and the porosity of a nanoporous dielectric for the case where all ethanol is evaporated from the deposited sol. Typically, the higher porosity glycerol-based gels (generally less than about 0.51 g/cc) prefer a solvent exchange or other method to lessen shrinkage during drying. On the other hand, the lower porosity gels require care to prevent early gelation. This may comprise pH adjustment, temperature control, or other methods known in the art. In some applications, it is also permissible to allow high volatility solvent evaporation after gelation.

As described above, the higher density glycerol-based gels (generally greater than about 0.64 g/cc) can be aged and dried with little shrinkage, even without a solvent exchange. An unaged wafer may be placed in a small volume furnace, or a small container, which can go on a hot plate. After an optional evacuation, the container is sealed at room temperature. The container remains sealed as the temperature is ramped up, quickly aging the film, and lowering the aging/drying fluid viscosity. After sufficient aging (possibly during the temperature ramp), the gel is ready for drying. At temperatures near glycerol's boiling point, the glycerol viscosity can be low enough (compared to the strength of an aged film of the predetermined porosity), that the glycerol in the furnace atmosphere can be removed and the film directly dried. Note that, in the most demanding low density applications, a somewhat lower surface tension can be obtained by increasing the drying temperature above the boiling point of glycerol. In these cases, the furnace needs to withstand the pressure (most sub-critical drying situations can be handled with pressures under 1 to 3 MPa). Additionally, care needs to be taken that the glycerol in the furnace atmosphere is, especially at first, slowly removed. The glycerol in the furnace atmosphere may be removed, e.g., by bleeding off the pressure, by a vacuum pump, or by sweeping the glycerol off with a gas. The furnace temperature may be held constant or continue to be raised while the glycerol is being removed (the furnace may be ramped on up to the bake temperature while sweeping the glycerol off with the gas). While some glycerol can be introduced during heating to minimize evaporation from the film, preferably the furnace volume is low enough that evaporation does not significantly reduce film thickness even without the introduction of glycerol during heating. If a film requires supercritical drying, perhaps to eliminate even temporary shrinkage, it is preferable to use a $CO_2$ solvent exchange as is well known in the art.

Although the same stock solutions can be used for bulk aerogels as thin film aerogels, the processing is substantially different. With different stock solution mixtures, the following example can be adapted to provide bulk gels with different porosities. In accordance with a bulk aerogel embodiment of the present invention, mix 208.0 mL TEOS, 61.0 mL glycerol, 208.0 mL ethanol, 16.8 mL water, and 0.67 mL 1M $HNO_3$ and reflux for 1.5 hours at ~60° C. to form a stock solution. Equivalently, mix 0.93 mol TEOS, 0.84 mol glycerol, 3.56 mol ethanol, 0.93 mol water, and 6.80E-4 mol $HNO_3$ and reflux for 1.5 hours at ~60° C. This is typically stored in a refrigerator at ~7° C. to maintain stability until use. The stock solution is preferably warmed to room temperature prior to placing into molds. After pouring into molds, the ethanol, water, and acid is allowed to evaporate, but due to glycerol's low volatility, no substantial evaporation of the glycerol is occurring. This evaporation reduces the volume of the stock solution precursor sol and concentrates the silica content of the sol. It is allowable for at least some of the evaporation to occur before filling the mold. This pre-fill evaporation might be especially useful if the configuration of the mold does not lend itself to substantial evaporation after filling, such as a low exposed surface area mold or a mold configuration that is incompatible with shrinkage. Although this evaporation is not required, it has several advantages, including faster gelation without a catalyst and less shrinkage after gelation.

After this evaporation, the sol has an approximately known ratio of silicon to pore fluid at the gel point. This ratio is approximately equal to the ratio of TEOS to glycerol in the precursor mix (with minor changes due to remaining water, continued reactions and incidental evaporation). As this method largely prevents the gel from permanently collapsing, this ratio determines the density of the aerogel that will be produced. If the sol does not gel during evaporation, this sol will gel soon after substantially all of the water, ethanol, and acid has evaporated.

Alternatively, one may catalyze the precursor with 0.5M ammonium nitrate before filling the mold. With this mixture, the sol typically gels in minutes. Remove the wet gel from the mold and allow the ethanol and water to evaporate. Typically, the gel will shrink during this evaporation. However, as with the other approaches, when the evaporation is substantially complete, the sol has an approximately known ratio of silicon to pore fluid at the gel point. This ratio is approximately equal to the ratio of TEOS to glycerol in the precursor mix (with minor changes due to remaining water, continued reactions and incidental evaporation). As this method largely prevents the gel from permanently collapsing, this ratio determines the density of the aerogel that will be produced.

After gelation, the wet gel comprises a porous solid and a pore fluid, and can preferably be allowed time to age at one or more controlled temperatures. Aging may preferably be accomplished by letting the substrate and gel sit for approximately 24 hours at about 25° C. or by heating it to 130–150° C. for about 5 minutes in a closed container. These high temperature aging parameters are valid for a 5 mm diameter bulk aerogel. However, due to the wet gel's low thermal conductivity, the high temperature accelerated aging time and temperature combinations are highly dependent upon the configuration of the bulk gel.

After this initial aging, remove the gel from the molds and dry directly from the mother liquor (that is, the pore fluid remaining at the end of aging, with no solvent exchanges for aging or drying). A slow ramp to and hold at about 500° C. will dry the gel.

Instead of drying directly from the mother liquor, it may be preferable, particularly with higher porosity gels, to perform a solvent exchange. This solvent exchange may be carried out as a one or two step process. The first step replaces the aging fluid with an intermediate and the second step preferably replaces the intermediate fluid with a low surface tension drying fluid such as heptane. In this method, It is preferable to remove the gels from the molds and place it in sealed tubes containing ethanol and allow a pore fluid exchange for 8 hours at 50 degrees C. At the end of a 8 hour interval, rinse the gels with ethanol and then store in fresh ethanol in an oven at 50 degrees C. After three to six such intervals, replace the ethanol with hexane in a similar manner. This solvent exchange method allows us to remove nearly all the glycerol-containing fluid before drying. The drying fluid (heptane in this case) is finally allowed to evaporate from the wet gel, forming a dry aerogel. If the film can be satisfactorily dried from a liquid that is soluble with the aging fluid, the intermediate may not be required. In many cases, the wet gel can be dried directly from ethanol, or other suitable solvent.

After drying, it is often preferable to bake the aerogel for a short time (such as 300° for 15 to 60 minutes) to help remove any residual materials, such as organics, that are in or on the aerogel. In some applications, it is also desirable to dehydroxylate (anneal) the dried gel. This may be done by placing the dry aerogel in a dry atmosphere comprising a surface modification agent, such as trimethyl-chlorosilane (TMCS), hexamethyldisilazane (HMDS), or hexaphenyldisilazane vapor. The HMDS will replace much of the water and/or hydroxyls bound to the dried gel's pore surfaces with methyl groups. This replacement can be performed at room temperature, or warmer. This replacement can not only remove water and/or hydroxyls, it can also render the dried gel hydrophobic (water repelling). The hexaphenyldisilazane will also remove water and/or hydroxyls and render the dried gel hydrophobic. However, the phenyl groups have a higher temperature stability than the methyl groups.

In accordance with an ethylene glycol-based embodiment of the present invention, mix tetraethoxysilane (TEOS), ethylene glycol, ethanol, water, and acid (1M $HNO_3$) in a molar ratio of 1:2.4:1.5:1:0.042 and reflux for 1.5 hours at ~60° C. After the mixture is allowed to cool, the solution is diluted down with ethanol to a composition of 70% (by volume) original stock solution and 30% (by volume) ethanol. This is mixed vigorously and typically stored in a refrigerator at ~7° C. to maintain stability until use. The solution is warmed to room temperature prior to film deposition. A mixture of stock solution and 0.25M $NH_4OH$ catalyst (10:1 volume ratio) is combined and mixed. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in an atmosphere that is uncontrolled. However, it is preferable to deposit and gel the sol in a clean room with standard humidity controls. During and after this deposition and spinning, the ethanol/water mixture is evaporating from film 14, but due to ethylene glycol's low volatility, no substantial evaporation of the ethylene glycol is occurring. This evaporation shrinks thin film 14 and concentrates the silica content of the sol forming reduced thickness film 18. FIG. 12B shows a reduced thickness sol film 18 obtained after substantially all (about 95% or more) of the ethanol has been removed. This concentrating, combined with the catalyst, typically causes gelation within minutes or seconds.

Film 18 has an approximately known ratio of silicon to pore fluid at the gel point. This ratio is approximately equal to the ratio of TEOS to ethylene glycol in the as-deposited sol (with minor changes due to remaining water, continued reactions and incidental evaporation). To the extent that the gel is prevented from collapsing, this ratio will determine the density of the aerogel film that will be produced from the sol thin film.

After gelation, the thin film wet gel 18 comprises a porous solid and a pore fluid, and can preferably be allowed time to age at one or more controlled temperatures, e.g., about a day at room temperature. It should be noted that the pore fluid changes somewhat during processing. These changes may be due to continued reactions and/or evaporation/ condensation. Aging may preferably be accomplished by letting the device sit in a low volume aging chamber for approximately 5 minutes at about 100 degrees C.

Aged film 18 may be dried without substantial densification by one of several methods, including supercritical fluid extraction, or a solvent exchange followed by air drying. However, it is preferable to air dry the film 18 from the aging fluid, as described in the third glycerol embodiment. The nanoporous dielectric can then be subjected to a post-dry bake and/or a surface modification, as described in the first glycerol embodiment.

In accordance with another ethylene glycol-based embodiment of the present invention, mix tetraethoxysilane (TEOS), ethylene glycol, water, and acid (1M $HNO_3$) in a molar ratio of 1:4:1:0.042 and reflux for 1.5 hours at ~60° C. This is typically stored in a refrigerator at ~7° C. to maintain stability until use. The solution is preferably warmed to room temperature prior to film deposition. 3–5 mL of this precursor sol may be dispensed (without catalyst) at room temperature onto substrate 10, which is then spun at 1500 to 5000 rpm (depending on desired film thickness) for about 5–10 seconds to form sol thin film 14. The deposition can be performed in an atmosphere that is uncontrolled. However, it is preferable to deposit and gel the sol in a clean room with standard humidity controls. During and after this deposition and spinning, ethanol and water is evaporating from film 14, but due to ethylene glycol's low volatility, no substantial evaporation of the ethylene glycol is occurring. This evaporation shrinks thin film 14 and concentrates the silica content of the sol forming reduced thickness film 18. FIG. 12B shows a reduced thickness sol film 18 obtained after substantially all (about 95% or more) of the water has been removed. This concentrating typically causes gelation within minutes.

After gelation, the thin film wet gel 18 comprises a porous solid and a pore fluid, and can preferably be allowed time to age at one or more controlled temperatures, e.g., about a day at room temperature. It should be noted that the pore fluid changes somewhat during processing. Aging may preferably be accomplished by letting the device sit in a low volume aging chamber for approximately 5 minutes at about 100 degrees C.

Aged film 18 may be dried without substantial densification by one of several methods, including supercritical fluid extraction, or a solvent exchange followed by air drying. However, it is preferable to air dry the film 18 from the aging fluid, as described in the third glycerol embodiment. The nanoporous dielectric can then be subjected to a post-dry bake and/or a surface modification, as described in the first glycerol embodiment.

Figure 16A:
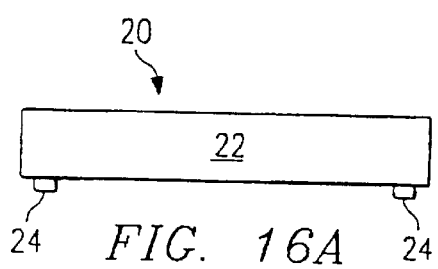
FIGS. 16A and 16B contain, respectively, a cross-sectional and a plan view of a sol-gel thin film processing apparatus according to the present invention.
Figure 16B:
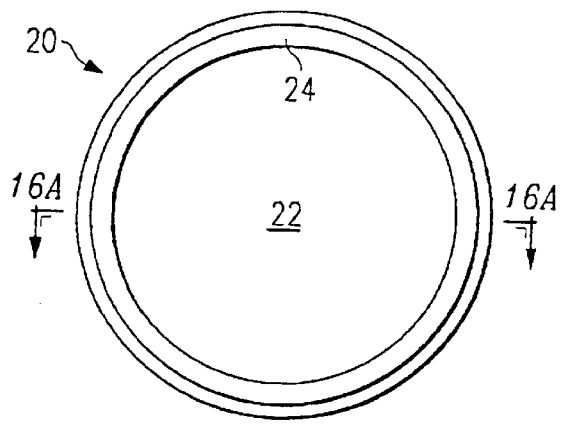
Figure 16C:
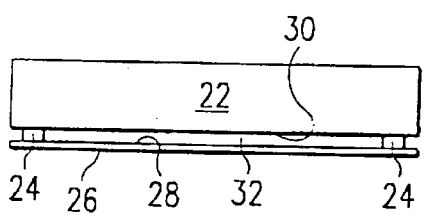
FIG. 16C contains a cross-sectional view of the same apparatus in contact with a substrate.

The discussion to this point has shown some of the advantages of aging in a closed container. Since suitable aging chambers do not seem to exist, we will describe the chambers we have invented to implement this process. One embodiment of aging container is illustrated in FIGS. 16A, 16B and 16C. In this embodiment, a processing apparatus comprises a body 20, having a substantially planar plate 22 with a resilient seal 24 attached thereto. Plate 22 need only be planar to the extent necessary to provide clearance with a thin film during operation, and may be constructed of any material compatible with the underlying process (e.g., semiconductor fabrication), although materials with high thermal conductivity, such as stainless steel, glass, or aluminum are preferred. Resilient seal 24 should preferably be designed to withstand wet gel processing temperatures and pore fluids; many suitable materials, including TEFLON- and neoprene-based materials, are known to those of ordinary skill in the art. Depending on the nature of temperature control used in the apparatus, it may be preferable to have seal 24 be either substantially thermally insulating or thermally conductive.

In operation, body 20 may simply be rested on a substrate 26, as shown in FIG. 16C. This substrate may be an optical substrate, such as glass or plastic, or a semiconductor substrate, such as a Si wafer. In this embodiment, seal 24 functions both as an atmospheric seal and as a spacer which sets the volume of chamber 32 formed by substrate surface 28, chamber surface 30 and seal 24. For example, seal 24 may be designed to compress to a thickness of about 1 mm under the weight of plate 22, thus creating chamber 32 with a 1 mm height when body 20 is placed on substrate 26. For many thin film applications, chamber 32 need only be substantially sealed, as some small degree of vapor leakage over the course of processing substrate 26 will not appreciably affect the final film properties.

Body 20 finds application at many points in an aerogel thin film process. It may be used to limit evaporation before a sol film has gelled, as an aging chamber for wet gel thin films, as a storage or transport chamber for such films, or as a drying chamber. In all of these applications, it is recognized that both sol and gel thin films contain extremely small amounts of liquid, such that a chamber of limited volume is necessary to prevent substantial evaporation from the film.

Figure 17A:
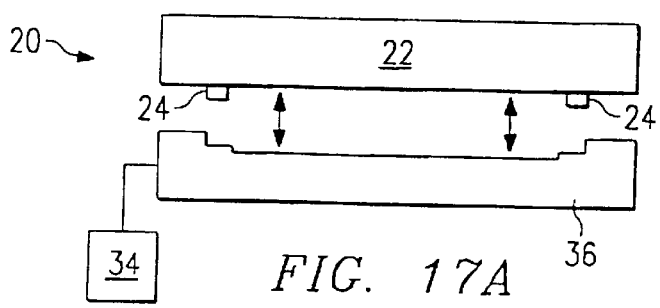
FIGS. 17A and 17B contain, respectively, cross-sectional views of another apparatus according to the present invention, empty and enclosing a substrate.
Figure 17B:
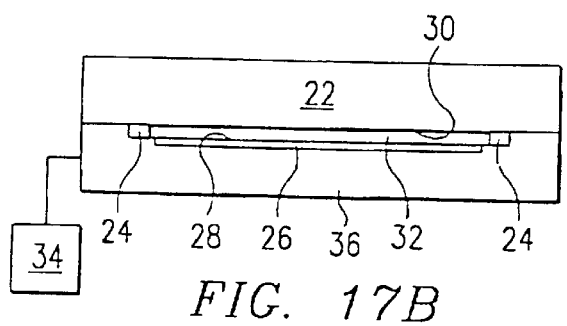

In another embodiment, body 20 may comprise more elements, as shown in FIGS. 17A and 17B. In this embodiment, body 20 additionally comprises a substrate holder 36 and substrate temperature control means 34. This embodiment shows the additional aspect of a seal 24 located outboard of the substrate (or in some cases seal 24 may even be deleted), such that a thin film may be formed on the entirety of substrate surface 28. When chamber 32 is closed, planar plate 22 and wafer holder 36 may be thermally coupled such that temperature control means 34 may be used to simultaneously regulate the temperature of body 20, substrate 26 and chamber 32.

Figure 18A:
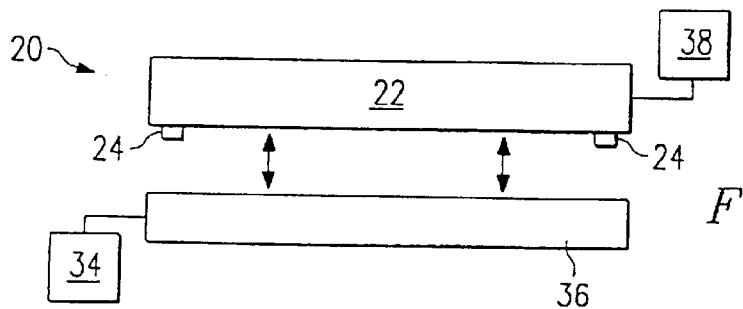
FIGS. 18A and 18B contain, respectively, cross-sectional views of yet another apparatus according to the present invention, empty and enclosing a substrate.
Figure 18B:
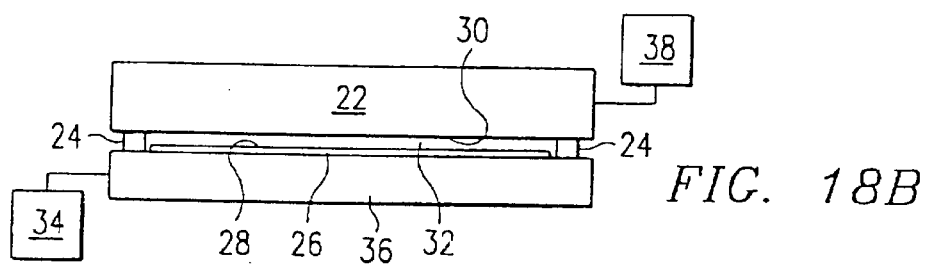

In another embodiment shown in FIGS. 18A and 18B, seal 24 provides some degree of thermal isolation between planar plate 22 and wafer holder 36. This allows temperature control means 34 to control substrate temperature, while separate temperature control means 38 are used to control planar plate temperature. Such an embodiment may have an advantage for drying a wet gel film, as the temperature of planar plate 22 can be selectively lowered to promote condensation on chamber surface 30.

Figure 19A:
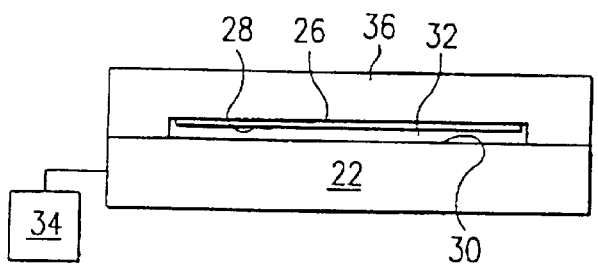
FIGS. 19A, 19B and 19C contain cross-sectional views of additional apparatus configurations which illustrate other aspects of the invention.
Figure 19B:
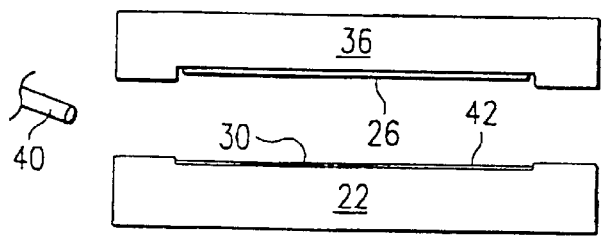
Figure 19C:
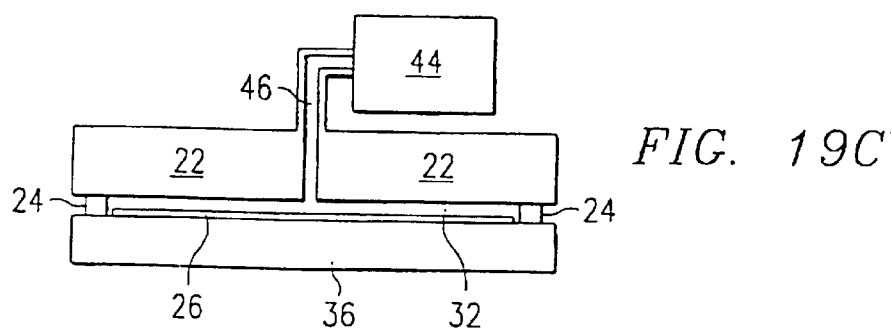

FIGS. 19A, 19B and 19C show additional aspects of these aging chambers. For example, in FIG. 19A, substrate 26 is shown being processed in an inverted position. In this embodiment, accidental or purposeful condensation onto chamber surface 30 may be collected without the possibility of such condensation dropping onto substrate surface 26. In FIG. 19B, not only is substrate 26 processed inverted, but a first solvent layer 42 (preferably of the same composition as at least one pore fluid) is dispensed, e.g., from a first solvent supply tube 40, onto chamber surface 30 prior to closing the chamber. In this embodiment, layer 42 may be used to help saturate the processing atmosphere, resulting in less evaporation of pore fluid from substrate 26.

In FIG. 19C, an embodiment is shown wherein some atmospheric adjustment means 44 is connected through at least one port 46 (which may be closeable) to chamber 32. Atmospheric adjustment means 44 may be used to create a vacuum or to overpressure chamber 32 as appropriate, or to exchange the atmosphere in chamber 32, or to supply a pore fluid vapor to chamber 32. This embodiment may be used, for example, to age a thin film at a temperature higher than the boiling point of a pore fluid, by operating chamber 32 at above atmospheric pressure. This embodiment may also be used to remove at least a portion of the pore fluid vapor from chamber 32 after aging, thereby allowing the thin film to dry.

Although this invention has been described in terms of several embodiments, many of these steps may be modified within the scope of the invention, and other steps can be included to enhance the overall process. For example, the initial thin film may be deposited by other common methods, such as dip-coating, flow coating, or spray-coating instead of spin-coating. Likewise, the solvent exchange may use dip coating, spray coating, or immersion in a liquid or vaporous solvent instead of spin-coating. When using a vaporous solvent, the wafer may be cooled to a temperature lower than the atmosphere, thus promoting condensation on the wafer. While water might otherwise be considered a solvent in such a process, for discussion purposes in this application, water is not considered a solvent.

Although both glycerol and ethylene glycol each have unique advantages, there are other low volatility solvents that can be useful in low shrinkage nanoporous dielectric fabrication. Although it is preferable to analyze a solvent to determine its expected evaporation rate, a preliminary preference on the selection of the low volatility solvent can be made. Nearly all solvents that have a low evaporation rate at room temperature will have a boiling point greater than 140° C. Although some solvents with boiling points less than 140° C. may be useful, a preferred evaporation rate will typically be found with solvents that have a boiling point greater than 160° C., and more preferably greater than 190° C. Solvents with boiling points greater than 230° C. may also have low enough evaporation rates to be suitable for deposition and/or aging with little atmospheric control for short periods of time at 40–80° C. For processing at 100–150° C. with little atmospheric control, it is preferable to use solvents with boiling points greater than 270° C. This gives some rough preferences on the lower limit of preferred boiling points. There are also rough preferences on the upper limit of preferred boiling points. Most solvents with boiling points greater than 500° C. will be so viscous that they require extra care during processing. Typically, the more useful solvents will have boiling points less than 350° C., and preferably less than 300° C. If it is not convenient to dilute or heat the sol during deposition, it may even be preferable to use a low volatility solvent with a boiling point less than 250° C. If no one solvent gives all the desired properties, two or more may be mixed to improve the performance. Thus, our initial preliminary preference on the selection of the low volatility solvent is a boiling point in the 175–250° C. range and (for TEOS based gels) that it be miscible with both water and ethanol. Based on these preliminary preferences, some suitable low volatility solvent candidates besides glycerol and ethylene glycol are 1,4-butylene glycol and 1,5-pentanediol.

If it is convenient to do the deposition and aging above room temperature, this opens up additional possibilities. One modification would be to use a solvent that is not a liquid, but a solid, at room temperature. This allows the potential use of many more materials. Many of these higher melting point materials have even lower volatility than the low volatility "room temperature liquid solvents" (liquid solvents) have at elevated deposition and aging temperatures. Although there is no required upper melting point temperature, process simplicity indicates that these "room temperature solid solvents" (solid solvents) should have melting points less than 60 degrees C., and preferably less than 40 degrees C. An additional desirable feature for a potential solid solvent is that it readily solidify to an amorphous phase. This amorphous solidification would reduce the chance of gel damage during an accidental cooling. Additionally, this might allow the solvent to be removed by freeze drying. An alternative approach to maintaining the precursor temperature above the melting point of a solid solvent is to dissolve the solid solvent in a carrier liquid. This carrier liquid can be water, alcohol, or any other liquid typically used in thin film aerogel/xerogel processing. The carrier liquid could also be a compatible liquid introduced only as a carrier.

The surprisingly good behavior of glycerol and ethylene glycol give some clues to other preferred solvents. We have identified several solvents that may give properties slightly different than either ethylene glycol or glycerol, yet still retain many of their advantages. The most promising additional solvents include 1,2,4-butanetriol; 1,2,3- butanetriol; 2 methyl-propanetriol; and 2-(hydroxymethyl)-1,3-propanediol; 1-4, 1-4, butanediol; and 2-methyl-1,3-propanediol. Other potential solvents include the polyols, either alone or in combination with ethylene glycol, glycerol, or other solvents.

This use of a low volatility solvent allows a loosening of the required atmospheric control during deposition, gelation, and/or aging. This is because, that even though saturation should still preferably be avoided, the atmospheric solvent concentration can be lowered without excessive evaporation. This wider concentration window can be used to allow wider variations in temperature across the deposition chamber (especially near the wafer and any evaporative cooling effects). An initial goal is to allow at least a 1 degree C temperature variation. Thus, the vapor concentration of the low volatility solvent in the atmosphere should be such that the condensation temperature (analogous to dew point) of the solvent vapor is at least 1 degrees Celsius less than the temperature of the substrate. Actually, the critical item is the surface of the deposited sol and/or gelled sol. However, the thin film nature of the sol keeps the temperature differences between the sol and the substrate small. Since it is may be much easier to measure the substrate temperature, these two temperatures will be used interchangeably in this patent. Even though 1 degree C temperature uniformity may be obtainable under some conditions, volume production will probably require at least a 3 degree C tolerance window, and preferably a 10 degree C tolerance window. However, the ultimate goal is to deposit, gel, and age in an uncontrolled or a substantially uncontrolled atmosphere. In this most preferred approach (a substantially uncontrolled atmosphere), atmospheric controls during deposition, gelation, and aging are limited to standard cleanroom temperature and humidity controls, although the wafer and/or precursor sol may have independent temperature controls. If this substantially uncontrolled atmosphere allows excessive evaporation, then either passive or less preferably, active atmospheric controls may be needed. For the purposes of this application, passive controls are limited to the placing the wafer in a relatively small container. This container may be partially or fully sealed and may or may not also contain a liquid reservoir of the solvent. However, the container will not have exotic environmental controls for the wafer, container atmosphere, and/or reservoir.

Another example of modification to the basic method is that, before drying (and generally, but not necessarily, after aging), the thin film wet gel 18 may have its pore surfaces modified with a surface modification agent. This surface modification step replaces a substantial number of the molecules on the pore walls with those of another species. If a surface modifier is applied, it is generally preferable to remove the water from the wet gel 18 before the surface modifier is added. The water can be removed by rinsing the wafer in pure ethanol, preferably by a low speed spin coating as described in the solvent exchange in the first embodiment example. This water removal is beneficial, because water will react with many surface modification agents, such as HMDS; however, it is not necessary. With our new glycerol-based method, surface modification need not be performed to help prevent pore collapse, but it can be used to impart other desirable properties to the dried gel. Some examples of potentially desirable properties are hydrophobicity, reduced dielectric constant, increased resistance to certain chemicals, and improved temperature stability. Some potential surface modifiers that may impart desirable properties include hexamethyldisilazane (HMDS), the alkyl chlorosilanes (trimethylchlorosilane (TMCS), dimethyldichlorosilane, etc.), the alkylalkoxysilanes (trimethylmethoxysilane, dimethyldimethoxysilane, etc.), phenyl compounds and fluorocarbon compounds. One useful phenyl compound is hexaphenyldisilazane. Some other useful phenyl compounds will typically follow the basic formula, $Ph_xA_ySiB_{(4-x-y)}$), where, Ph is a phenolic group, A is a reactive group such as Cl or $OCH_3$, and B are the remaining ligands which, if there are two, can be the same group or different. Some examples of these phenyl surface modification agents include compounds with 1 phenolic group such as phenyltrichlorosilane, phenyltrifluorosilane, phenyltrimethoxysilane, phenyltriethoxysilane, phenylmethylchlorosilane, phenylethyldichlorosilane, phenyldimethylethoxysilane, phenyldimethylchlorosilane, phenyldichlorosilane, phenyl (3-chloropropyl)dichlorosilane, phenylmethylvinylchlorosilane, phenethyldimethylchlorosilane, phenyltrichlorosilane, phenyltrimethoxysilane, phenyltris(trimethylsiloxy)silane, and phenylallyidichlorosilane. Other examples of these phenyl surface modification agents include compounds with 2 phenolic groups such as diphenyldichlorosilane, diphenylchlorosilane, diphenylfluorosilane, diphenylmethylchlorosilane, diphenylethylchlorosilane, diphenyidimethoxysilane, diphenylmethoxysilane, diphenylethoxysilane, diphenylmethylmethoxysilane, diphenylmethylethoxysilane and diphenyidiethoxysilane. These phenyl surface modification agents also include compounds with 3 phenolic groups such as triphenylchlorosilane, triphenylflourosilane, and triphenylethoxysilane. Another important phenyl compound, 1,3-diphenyltetramethyidisilazane, is an exception to this basic formula. These lists are not exhaustive, but do convey the basic nature of the group. The useful fluorocarbon based surface modification agents include (3,3,3-trifluoropropyl) trimethoxysilane), (tridecafluoro-1,1,2,2-tetrahydrooctyl)-1 dimethylchlorsilane, and other fluorocarbon groups that have a reactive group, such as Cl or $OCH_3$, that will form covalent bonds with a hydroxyl group.

The paragraph above lists some of the typical useful properties for many conventional applications. However, there are other potential applications for nanoporous dielectrics and aerogels that may have different desirable properties. Examples of some other potentially desirable properties include hydrophilicity, increased electrical conductivity, increased dielectric breakdown voltage, increased or decreased reactivity with certain chemicals, and increased volatility. This list is not exhaustive. However, it shows that, depending upon the application, many different types of properties may be desirable. Thus, it is clear that many other materials that will form covalent bonds with hydroxyl groups are potential surface modifiers that may impart other potentially desirable properties.

This invention also comprises the use of gelation catalysts, such as ammonium hydroxide. This also includes the allowance of other gelation catalysts in place of the ammonium hydroxide and/or for the gelation catalyst to be added after deposition. Typically, these alternate catalysts modify the pH of the sol. It is preferable to use catalysts that raise the pH, although acid catalysts can be used. Typically, acid catalysis results in longer processing times and a denser dielectric than a base catalyzed process. Some examples of other preferred gelation catalysts include ammonia, the volatile amine species (low molecular weight amines) and volatile fluorine species. When the catalyst is added after deposition, it is preferable to add the catalyst as a vapor, mist, or other vaporish form.

This invention allows production of nanoporous dielectrics at room temperature and atmospheric pressure, without a separate surface modification step. Although not required to prevent substantial densification, this new method does not exclude the use of supercritical drying or surface modification steps prior to drying. To the extent that the freezing rates are fast enough to prevent large (e.g., 50 nm) crystals, it is also compatible with freeze drying. In general, this new method is compatible with most prior art aerogel techniques.

Other examples of modifications involve the reaction atmosphere and/or temperature. Also coating and gelation need not be performed in the same chamber or even in the same atmosphere. For instance, the substrate may have its temperature lowered to retard gelation or elevated to speed surface modification and/or gelation. Also, total pressure and/or temperature may be varied to further control evaporation rates and/or gel time. Elevated temperature processing is typically performed at no less than 40° C.; however, 50° C. is preferred, and 70° C. is more preferred. When working at elevated temperatures, care should be taken (e.g., the partial pressures in the reaction atmosphere should be high enough) to prevent solvent boiling.

Although TEOS has been used as a representative example of a reactant, other metal alkoxides may be used either alone or in combination with TEOS or each other to form a silica network. These metal alkoxides include tetramethoxysilane (TMOS), methyltriethoxysilane (MTEOS), 1,2-Bis(trimethoxysilyl)ethane (BTMSE), combinations thereof, and other silicon-based metal alkoxides known in the art. A sol may also be formed from alkoxides of other metals known in the art such as aluminum and titanium. Some other precursor sols known in the art include particulate metal oxides and organic precursors. Two representative particulate metal oxides are pyrogenic (fumed) silica and colloidal silica. Some representative organic precursors are melamine, phenol furfural, and resorcinol. In addition to alternate reactants, alternate solvents may also be used. Some examples of preferred alternates for ethanol are methanol and the other higher alcohols. Other acids may be used as a precursor sol stabilizer in place of the nitric acid.

An additional modification is to allow and/or promote the formation of moderate sized (15 to 150 monomers per molecule) oligomers in the precursor sol. These larger oligomers may speed the gelation process in the deposited sol. A sol containing large oligomers may have a higher viscosity than a sol with small oligomers. However, as long as the viscosity is stable, this higher viscosity can be compensated by methods known in the art, such as adjusting solvent ratios and spin conditions. To help achieve this desired stable viscosity, the oligomerization may need to be slowed or substantially halted before deposition. Potential methods of promoting oligomerization might include heating the precursor sol, evaporating solvent, or adding small amounts of a gelation catalyst such as ammonium hydroxide. Potential methods of retarding oligomerization might include cooling the precursor sol, diluting the sol with a solvent, or restoring the precursor sol to a pH that minimizes condensation and gelation (Nitric acid could be used in conjunction with the ammonium hydroxide exemplified above).

Although the present invention has been described with several sample embodiments, various changes and modifications may be suggested to one skilled in the art. It is intended that the present invention encompass such changes and modifications as fall within the scope of the appended claims.

What is claimed is:

1. A non-supercritical method of forming a nanoporous aerogel, said method comprising the steps of:

providing an aerogel precursor sol, said sol comprising an at least partially hydrolyzed metal alkoxide dispersed in a first solvent and a second solvent, evaporating substantially all of said second solvent while preventing substantial evaporation of said first solvent, and allowing the sol to create a gel, wherein the gel comprises a porous solid and a pore fluid;

continuing to prevent substantial evaporation of said first solvent from said sol until a drying step, wherein said drying step comprises forming a dry aerogel by removing the pore fluid in a non-supercritical drying atmosphere without substantial collapse of the porous solid; whereby the skeletal density of the dry aerogel is determined approximately by the volume ratio of said metal alkoxide to said first solvent in said aerogel precursor sol.

2. The method of claim 1, wherein said gel is created before said evaporating step completes.

3. The method of claim 1, wherein said drying step further comprises a solvent exchange.

4. The method of claim 1, further comprising aging said gel before said drying step.

5. A non-supercritical method of forming an aerogel film on a substrate, said method comprising the steps of:
- depositing a film of an aerogel precursor sol on a substrate, said sol comprising a first solvent and a second solvent;
- preferentially evaporating substantially all of said second solvent from said film; and
- allowing said deposited sol to cross-link to form a wet gel having pores arranged in an open-pored structure on said substrate.

6. The method of claim 5, wherein said second solvent comprises a reaction product of said cross-linking step.

7. The method of claim 5, wherein said second solvent has a vapor pressure which is at least twice the vapor pressure of said first solvent.

8. The method of claim 5, wherein said depositing a thin film step comprises spin-coating said aerogel precursor sol onto said substrate.

9. The method of claim 5, further comprising drying said wet gel in a non-supercritical atmosphere without substantial densification of said open-pored structure.

10. The method of claim 5, wherein said wet gel is formed before said evaporating step completes.

11. The method of claim 5, further comprising aging said wet gel without substantial evaporation of said first solvent.

12. A non-supercritical method for forming a thin film aerogel on a semiconductor substrate, the method comprising the steps of:
a) providing a semiconductor substrate comprising a microelectronic circuit;
b) depositing an aerogel precursor sol upon the substrate; wherein the aerogel precursor sol comprises
  a metal-based aerogel precursor reactant,
  a first solvent comprising glycerol, and
  a second solvent; wherein,
  the molar ratio of the molecules of the glycerol to the metal atoms in the reactant is at least 1:16;
c) allowing the deposited sol to create a gel, wherein the gel comprises a porous solid and a pore fluid; and
d) forming a dry aerogel by removing the pore fluid in a non-supercritical drying atmosphere.

13. The method of claim 12, wherein the first solvent also comprises a polyol.

14. The method of claim 13, wherein the polyol is a glycol.

15. A method of providing a metal-based dielectric nanoporous aerogel film on a semiconductor substrate, comprising the steps of:
providing a semiconductor substrate;
providing an aerogel precursor reactant taken from the class consisting of metal alkoxides, at least partially hydrolyzed metal alkoxides, particulate metal oxides and combinations thereof, the aerogel precursor reactant mixed with a first solvent taken from the class consisting of ethylene glycol; glycerol; 1,4 butylene glycol; 1,5 pentanediol; 1,2,4-butanetriol; 1,2,3-butanetriol; 2 methyl-propanetriol; 2-(hydroxymethyl)-1,3-propanediol; 1-4, 1-4, butanediol; 2-methyl-1,3-propanediol; and combinations thereof, the molar ratio of the first solvent molecules to the metal atoms in the aerogel precursor reactant being at least 1:16, thereby forming an aerogel precursor sol; and
forming the dielectric nanoporous aerogel film on the substrate by:
  applying the aerogel precursor sol to the semiconductor substrate;
  hydrolyzing the aerogel precursor sol on the semiconductor substrate; and
  condensing the aerogel precursor sol on the semiconductor substrate.

16. The method according to claim 15, wherein the aerogel precursor reactant is glycerol.

17. The method according to claim 15, wherein the molar ratio of the first solvent molecules to the metal atoms in the reactant is no greater than 12:1.

18. The method according to claim 15, wherein the molar ratio of the first solvent molecules to the metal atoms in the reactant is between 1:2 and 12:1.

19. The method according to claim 15, wherein the molar ratio of the first solvent molecules to the metal atoms in the reactant is between 1:4 and 4:1.

20. The method according to claim 15, wherein the molar ratio of the first solvent molecules to the metal atoms in the reactant is between 2.5:1 and 12:1.

21. The method according to claim 15, wherein the reactant is a metal alkoxide selected from the group consisting of tetraethoxysilane, tetramethoxysilane, methyltriethoxysilane, 1,2-Bis(trimethoxysilyl)ethane and combinations thereof.

22. The method according to claim 15, wherein the reactant is tetraethoxysilane.

23. The method according to claim 22, wherein the tetraethoxysilane is at least partially hydrolyzed.

24. The method according to claim 15, wherein the first solvent is ethylene glycol.

25. The method according to claim 15, wherein the aerogel precursor reactant is also mixed with a second solvent.

26. The method according to claim 25, wherein the second solvent is an alcohol.

27. The method according to claim 25, wherein the second solvent is ethanol.

28. The method according to claim 15, wherein the aerogel precursor reactant is also mixed with a pH modification agent.

29. The method according to claim 15, wherein the aerogel precursor reactant is also mixed with an acid.

30. The method according to claim 29, wherein the acid is nitric acid.

31. The method according to claim 15, wherein the aerogel precursor reactant is also mixed with a gelation catalyst.

32. The method according to claim 31, wherein the gelation catalyst is ammonium hydroxide.

33. The method according to claim 31, wherein the pH of the sol is between 7 and 9.

34. The method according to claim 15, wherein the viscosity of the sol is between 1 and 12 centipoise.

35. The method according to claim 15, wherein the viscosity of the sol is between 1 and 5 centipoise.

36. The method according to claim 15, wherein the reactant is selected from the group consisting of pyrogenic silica, colloidal silica, and combinations thereof.

37. A non-supercritical method of forming an aerogel film on a substrate, said method comprising the steps of:
depositing a film of an aerogel precursor sol on a substrate, said sol comprising a first solvent and a second solvent;

preferentially evaporating substantially all of said second solvent from said film; and allowing said deposited sol to cross-link to form a wet gel having pores arranged in an open-pored structure on said substrate;

wherein said preferentially evaporating step begins before said deposited sol begins to cross-link.

38. The method of claim 37, wherein said second solvent comprises a reaction product of said cross-linking step.

39. The method of claim 37, wherein said second solvent has a vapor pressure which is at least twice the vapor pressure of said first solvent.

40. The method of claim 39, wherein said depositing a thin film step comprises spin-coating said aerogel precursor sol onto said substrate.

41. The method of claim 37, further comprising drying said wet gel in a non-supercritical atmosphere without substantial densification of said open-pored structure.

42. The method of claim 37, wherein said wet gel is formed before said evaporating step completes.

43. The method of claim 37, further comprising aging said wet gel without substantial evaporation of said first solvent.

* * * * *